United States Patent
Chavez et al.

(10) Patent No.: US 12,153,116 B2
(45) Date of Patent: Nov. 26, 2024

(54) METHOD AND SYSTEM FOR MONITORING POWER LINES

(71) Applicant: NUGRID POWER CORP., Burnaby (CA)

(72) Inventors: Patrick Pablo Chavez, Coquitlam (CA); Farnoosh Rahmatian, West Vancouver (CA)

(73) Assignee: NUGRID POWER CORP., Burnaby (CA)

( * ) Notice: Subject to any disclaimer, the term of this patent is extended or adjusted under 35 U.S.C. 154(b) by 0 days.

(21) Appl. No.: 17/721,346

(22) Filed: Apr. 14, 2022

(65) Prior Publication Data

US 2023/0333191 A1    Oct. 19, 2023

(51) Int. Cl.
*G01R 35/00* (2006.01)
*G01R 31/08* (2020.01)
*H02J 13/00* (2006.01)

(52) U.S. Cl.
CPC ......... *G01R 35/005* (2013.01); *G01R 31/085* (2013.01); *H02J 13/00002* (2020.01)

(58) Field of Classification Search
CPC .... G01R 35/005; G01R 31/085; G01R 31/50; G01R 31/58; G01R 15/148; G01R 15/26; G01R 29/0878; G01R 29/0871; G01R 29/08; G01R 19/2513; H02J 13/00002; H02J 13/00022
See application file for complete search history.

(56) References Cited

U.S. PATENT DOCUMENTS

| | | | |
|---|---|---|---|
| 8,395,372 B2 * | 3/2013 | Harlev | G01R 15/246 250/225 |
| 2014/0343878 A1 * | 11/2014 | Gudmundsson | G01R 29/0814 702/64 |

OTHER PUBLICATIONS

A. Aboulian, J. S. Donnal and S. B. Leeb, "Autonomous Calibration of Non-Contact Power Monitors," in IEEE Sensors Journal, vol. 18, No. 13, pp. 5376-5385, 1 Jul. 1, 2018, doi: 10.1109/JSEN.2018.2837350. (Year: 2018).*

(Continued)

*Primary Examiner* — Son T Le
*Assistant Examiner* — Brian Butler Geiss
(74) *Attorney, Agent, or Firm* — Nexus Law Group LLP; Nicholas P. Toth

(57) ABSTRACT

A computer-implemented method of monitoring power lines of a polyphase power system. Data indicative of coefficients of a linear transformation is updated based on a deviation of a calibration vector from an estimate thereof. The linear transformation relates electric field or magnetic measurements around the power lines to the calibration vector corresponding to voltages or currents, respectively, in the power lines. The estimate is determined based on the data and the plurality of electric field or magnetic field measurements. The data indicative of the coefficients of the linear transformation is then used to estimate voltages or currents based on electric or magnetic field measurements to monitor the voltages or currents. A recalibration condition indicative of time, sensed environmental conditions, or user inputs may be used to achieve adaptive real-time monitoring. A system including a processor and computer-readable memory configured to cause the processor to carry-out the method.

1 Claim, 11 Drawing Sheets

(56) References Cited

OTHER PUBLICATIONS

E. Burkhardt, B. Zimmer and F. Jenau, "An Auto-Calibration Method for a Sensor Concept for Measuring Voltage with Overhead Line Indicators," 2021 IEEE International Conference on Environment and Electrical Engineering and 2021 IEEE Industrial and Commercial Power Systems Europe, 2021 pp. 1-6 (Year: 2021).*

E. Burkhardt, F. Jenau and M. Urban, "An Innovative Method for Voltage Detection in Overhead Line Systems," 2018 IEEE International Conference on Environment and Electrical Engineering and 2018 IEEE Industrial and Commercial Power Systems Europe (EEEIC / I&CPS Europe), Palermo, Italy, 2018, pp. 1-5 (Year: 2018).*

E. Burkhardt and F. Jenau, "Derivation and Verification of a Calculation Method for the Overhead Line Voltage Measurement considering the Influence of the Earth Conductor," 2018 IEEE International Conference on High Voltage Engineering and Application (ICHVE), Athens, Greece, 2018, pp. 1-4 (Year: 2018).*

Zhao, Q., Yang, S., Lu, L., Jiang, Z., Yang, W., & Huang, Z. (2021). Optimization method of electric field inverse problem based on intelligent algorithm. In E3S Web of Conferences (vol. 260, p. 02009). EDP Sciences. (Year: 2021).*

\* cited by examiner

METHOD AND SYSTEM FOR MONITORING POWER LINES

TECHNICAL FIELD

The disclosure relates generally to power distribution systems, and more particularly to methods and systems for monitoring power lines.

BACKGROUND

Real-time monitoring of voltages and currents of electrical power lines is important to ensure reliability and stability of the electrical distribution system. For example, local real-time measurements of voltages may facilitate detection of faults and identification of power-quality disturbances.

Power lines are typically classified into two categories of use, namely, transmission and distribution (T&D). Transmission refers to very long distance transfer of bulk power from remote and centralized power generation, such as a hydro power plant, to large urban centers and/or industrial sites. Distribution refers to the branching out and feeding of that bulk power to very many and much smaller consumers or loads. As such and to minimize power losses and costs in conductors, transmission typically is done at the highest practical voltages, i.e., at >100 kV-rms. In order to minimize space requirements at the user ends, distribution is done at lower voltages. T&D polyphase power line classes are typically designated to a few discrete nominal voltage levels or classes of operation specified by various standards, e.g., 208 V as the lowest voltage in North America; 15 kV, 25 kV, and 35 kV typical of medium voltage distribution systems; and 138 kV, 230 kV, and 500 kV typical of the higher voltage transmission systems. T&D power line currents can range up to hundreds of Amperes or even a few thousand Amperes in stead state conditions. Power lines, supported by transmission towers and distribution poles, may extend several tens or hundreds of kilometres.

Ensuring the stability of electrical T&D power delivery systems has become a central concern due to the increasing integration of renewable energy sources and active (nonlinear) loads into power distribution systems. The inverted (DC-to-AC) power supplied from solar panels and wind turbines, as well as the converted (AC-to-DC) power drawn from electric vehicles, variable frequency drives, and other modern devices, generally have less inertia and are more transient than power generated by conventional gas turbines and other fossil fuel-based generators and passive motors. As a result, such power can have greater variability, be less predictable, and may introduce a greater proportion of higher harmonics and inter-harmonic disturbances into the power delivery system, thereby rendering closed-loop control more important and also more challenging. Real-time monitoring of power lines is important for managing such issues and ensuring the stability of the modern power grid.

Conventional measurement approaches, intended for observing the aforementioned "high-inertia" power and primarily relying on induction employing ferromagnetic materials, typically involve inductive transformers and only allow for narrowband, low-dynamic-range voltage measurement. Similarly, conventional current measurement around the power frequency, e.g., 60 Hz in North America, may accrue disadvantages due to the inherent limited frequency range, nonlinear response, and sheer size and weight involved with the magnetic-flux-linking materials used in transformer technology. Voltage sensing devices designed to be a single unit measuring the voltage across a single pair of conductors are physically sandwiched between those two conductors of a power line and are in rigid contact with and mechanical fastened to the power line. Similarly, a current sensing device based on induction typically requires the current-carrying conductor to rigidly pass through its body. These approaches typically involve disruptive installation of componentry in the field. During installation of such componentry, the electrical T&D system may need to be at least partially turned off for safety due to the high voltages in power lines, e.g. 69 kV class, up to 1200 kV class. Installation may be time-consuming, and expensive. When monitoring of an entire electrical T&D system is required, such problems are compounded. Monitoring system may be prohibitively physically intrusive and/or costly.

Recently, electric field sensors (EF sensors) symmetrically scattered about a wire have been proposed as a way to infer voltage in the wire. The symmetric distribution is intended to eliminate environmental interference. Among other issues, such an approach can be costly and may suffer from a need to (a priori) accurately calculate stray capacitance between the sensors and the wires. Furthermore, installation of electric field sensors close to wires can be difficult, may involve safety risks, and may suffer from reduced reliability.

Remote technologies have been proposed that involve measuring the "composite" electric field far from electrical lines, e.g. three-phase power lines, and determining voltages in individual electrical lines based on the measured electric field by decoupling the influence of each of the electrical lines. "Composite" electric fields around electrical lines, even from close to the ground, can have several important contributors other than the electrical lines.

In general, Maxwell's equations (e.g. Gauss's law) and detailed information about the geometry (including distance from the ground), materials, and charge sources can be used together to relate voltages to measured electric fields. In some cases, monitoring may require the computationally expensive task of solving partial differential equations, integral equations, or geometry-based simpler models derived therefrom. Electrical power lines may have geometric configurations that vary significantly depending on installation factors and weather, e.g. wind, may experience a variety of air conditions e.g. variations in humidity and temperature, and may be situated in a great diversity of environments, which may change frequently and/or continuously, e.g. introducing or removing electrical charge sources.

SUMMARY

In an aspect, the disclosure describes a computer-implemented method of adaptive real-time monitoring of power lines of a polyphase power system. The computer-implemented method of adaptive real-time monitoring also includes (a) determining, by a processor, a recalibration condition indicative of at least one of a time, a sensed environmental condition, or a user input; (b) updating, by the processor and in response to the recalibration condition, data indicative of coefficients of a linear transformation relating a first plurality of sensor measurements to calibration quantities of the power lines, the updating being based on a residual indicative of a deviation of the calibration quantities from estimated calibration quantities, the estimated calibration quantities being determined based on the data indicative of the coefficients of the linear transformation and calibration data indicative of the first plurality of sensor measurements, the first plurality of sensor measurements being from a plurality of sensors positioned to measure a field around a portion of the power lines; (c) receiving, by the processor, data indicative of a second plurality of sensor measurements from the plurality of sensors; and (d) determining, by the processor, estimated quantities using the data indicative of the coefficients of the linear transformation and the data indicative of the second plurality of sensor measurements.

In an aspect, the disclosure describes a system for monitoring of power lines of a polyphase power system. The system also includes a plurality of electric field sensors positioned to measure an electric field around a portion of the power lines; a terminal; a processor; and computer-readable memory coupled to the processor and storing processor-executable instructions that, when executed, configure the processor to: (a) determine a recalibration condition indicative of at least one of a time, a sensed environmental condition, or a user input; (b) update, in response to the recalibration condition, data indicative of coefficients of a linear transformation relating a first plurality of electric field measurements to calibration voltages of the power lines, the updating being based on a residual indicative of a deviation of the calibration voltages from estimated calibration voltages determined based on the data indicative of the coefficients of the linear transformation and calibration data indicative of the first plurality of electric field measurements, the first plurality of electric field measurements being from a plurality of electric field sensors positioned to measure an electric field around a portion of the power lines, (c) receive data indicative of a second plurality of electric field measurements from the plurality of electric field sensors, and (d) determine estimated voltages using the data indicative of the coefficients of the linear transformation and the data indicative of the second plurality of electric field measurements to provide monitoring of the power lines of the polyphase power system.

In an aspect, the disclosure describes a computer-implemented method of monitoring of voltages in power lines of a polyphase power system. The computer-implemented method of monitoring of voltages also includes receiving, by a processor, calibration data indicative of a plurality of electric field measurements from a plurality of electric field sensors positioned to measure an electric field around the power lines; updating, by the processor, data indicative of coefficients of a linear transformation relating the plurality of electric field measurements to a calibration vector corresponding to the voltages of the power lines, components of the calibration vector being defined by a predetermined phase relationship of the voltages in the power lines, the updating being based on a residual indicative of a deviation of the calibration vector from an estimated calibration vector determined based on the data indicative of the coefficients of the linear transformation and the plurality of electric field measurements; and using, by the processor, the data indicative of the coefficients of the linear transformation to estimate voltages in the power lines based on received electric field measurements from the plurality of electric field sensors to monitor the voltages in the power lines.

In an aspect, the disclosure describes a computer-implemented method of adaptive real-time monitoring of three power lines of a three-phase power system. The computer-implemented method of adaptive real-time monitoring also includes (a) determining, by a processor, a recalibration condition indicative of an absence of power in only two power lines of the three power lines; (b) updating, by the processor and in response to the recalibration condition, data indicative of coefficients of a linear transformation using a plurality of sensor measurements associated with the absence of power, the first plurality of sensor measurements being from a plurality of sensors positioned to measure a field around a portion of the power lines; (c) receiving, by the processor, data indicative of a second plurality of sensor measurements from the plurality of sensors; and (d) determining, by the processor, estimated quantities using the data indicative of the coefficients of the linear transformation and the data indicative of the second plurality of sensor measurements.

In one aspect, there is disclosed a method of monitoring three power lines of a three-phase power system using three field sensors, each field sensor of the three field sensors being proximal to a corresponding power line of the three power lines relative to every remaining field sensor of the three field sensors, the method comprising: (a) determining a loss of power in the three power lines based on an environmental condition; (b) after determining a loss of power in the three power lines, determining re-energization of a first power line of the three power lines during absence of power in a second power line and a third power line of the three power lines; (c) during presence of power in the first power line and during absence of power in the second power line and the third power line, receiving a first plurality of field measurements from the three field sensors; (d) after determining re-energization of the first power line during absence of power in the second power line and the third power line, determining re-energization of the second power line during presence of power in the first power line and absence of power in the third power line; (e) during presence of power in the first power line and the second power line and absence of power in the third power line, receiving a second plurality of field measurements from the three field sensors; (f) after determining re-energization of the second power line during presence of power in the first power line and absence of power in the third power line, determining re-energization of the third power line during presence of power in the first power line and the second power line; (g) during presence of power in the three power lines, receiving a third plurality of field measurements from the three field sensors; (h) determining a matrix consisting of a first three coefficients, a second three coefficients, and a third three coefficients, by determining the first three coefficients based on the first plurality of field measurements, the second three coefficients based on the second plurality of field measurements, and the third three coefficients based on the third plurality of field measurements; (i) receiving a fourth plurality of field measurements from the three field sensors; and (j) determining estimated quantities associated with the three power lines using the matrix and the fourth plurality of field measurements to monitor the three power lines.

Embodiments can include combinations of the above features.

Further details of these and other aspects of the subject matter of this application will be apparent from the detailed description included below and the drawings.

DESCRIPTION OF THE DRAWINGS

Reference is now made to the accompanying drawings, in which.

DETAILED DESCRIPTION

Figure 1:
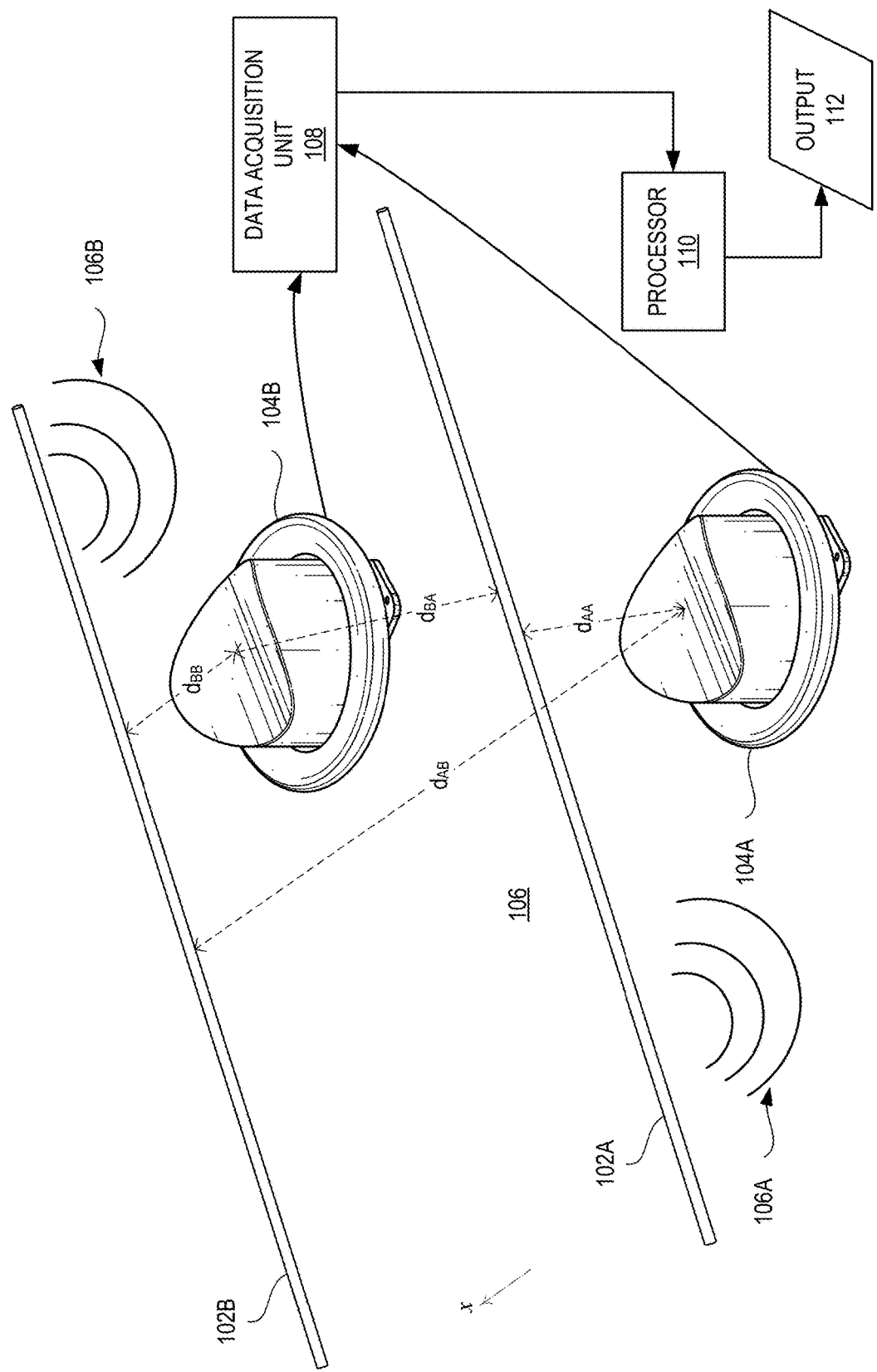
FIG. 1 is a perspective view of a plurality of electric field (EF) sensors in the presence of power lines in accordance with an embodiment.

The following disclosure relates to monitoring of electrical power lines. In some embodiments, the systems and methods disclosed herein can facilitate greater computational efficiency and real-time, adaptive monitoring of voltages in electrical power lines.

Real-time monitoring of power lines (conductors or power transmission lines) of electrical power distributions systems is important for ensuring stability and reliability of power distribution systems. In general, increasing integration of variable energy sources has increased the need for power grid monitoring. For example, it becomes more important to detect a significant "electrical event", such as a voltage surge or drop, the more frequent and pronounced such events become with increased complexity of the distribution system.

Electrical power distribution systems may be alternating current (AC) polyphase systems. In such systems, the power transfer along polyphase lines is nominally constant during each cycle of the electrical cycle and varies slowly from cycle to cycle and depending on the state of balance among generators and loads on either ends of the transfer. In polyphase lines, a plurality of conductors carry alternating current and are electrically out-of-phase with each other by a nominal phase offset. In three-phase systems, three power line phase conductors each carry an alternating current with voltage that is 120° out-of-phase with the voltage on each of the other two power phase conductors. For example, voltages in power lines may be as low as 15 kV or lower or as high as 500 kV or more.

Due to the high voltages and large distances involved, real-time monitoring of (voltages in) power lines can be challenging. However, high voltages and currents in the power lines together generate an electric field and a magnetic field, respectively, everywhere around the power lines that can be measured a distance away from the power lines, e.g. at the ground below overhead transmission lines. These electrical fields and magnetic fields may be related to the voltages and currents, respectively, in the power lines. Systems, computer-implemented methods, and computer products (e.g. non-transitory computer-readable memory) are described which may allow real-time, adaptive monitoring of voltages and/or currents in power lines using measurements of electric fields and/or magnetic fields around the power lines, including calibration, re-calibration in response to specific triggers, and transmittal of monitoring data to a terminal.

In a region where a static or quasistatic electric field is generated by n conductors (e.g. power lines) associated with respective n applied voltages, the electric field may be notionally deconstructed as a superposition of a plurality of electric fields (e.g. m≥n notional electric fields). Suppose we set a number of sensors k=n, we may associate each of the n electric fields and/or magnetic fields sensed by the sensors with only one conductor. In general, linearity of Maxwell's Equations that govern electromagnetism facilitates superposition of electric fields. It may then be assumed that each directional component of the electric field at any point in the region is a summation of directional electric field contributions from each conductor, and each contribution is proportional to the respective applied voltage.

Suppose that k≥n electric field (EF) sensors are deployed in the vicinity of the conductors, such as electrical power lines, to measure the (total or composite) electric field due to the n conductors at k points in proximity to the conductors.

It is found that a column vector of applied voltages ($\vec{v}$) in (electrical) power lines may be effectively related to a column vector ($\vec{e}$) of the directional components of the electric field sensed at the m points, by the relationship $$\vec{e} = M\vec{v} \quad (1)$$

or $$\vec{v} = C\vec{e} \quad (2)$$

where $M=M_{ij}$ and $C=C_{ij}$ are linear transformations; $M=M_{ij}$ may be an r-by-n matrix with coefficients $M_{ij}$ and $C=C_{ij}$ may be an n-by-r matrix with coefficients $C_{ij}$, where r≥m. If each sensor is associated with a single scalar measurement, then r=m. However, if each sensor is associated with more than one scalar measurement, then r≥m. For example, in some cases, three directional components of the electric field may be related to the voltages, and thus r=3m. As referred to herein, linear transformations may include linear operators. Linear operators may generally be finite-dimensional operators.

In some cases, voltages and/or electric field measurements may refer to averaged quantities and/or frequency components of quantities. In some embodiments, $\vec{v}$ and $\vec{e}$ may be phasors (complex numbers).

If the coefficients of C are known, unknown voltages in power lines may be estimated based on measurements from electric field sensors using equation (2).

In general, $\vec{v}$ may generally refer to applied voltages or quantities indicative thereof, e.g. functions (generally linear) of the applied voltages. Similarly, $\vec{e}$ may generally refer to electric field component measurements or quantities indicative thereof, e.g. functions (generally linear) of the electric field component measurements. For example, $\vec{v}$ and $\vec{e}$ may be composed of Fourier components (such as cartesian product or ordered product). It is understood that a linear function or mapping of applied voltages and/or electric fields may be subsumed in M and/or C. For example, averaging, filtering, frequency-time transformations such as Fourier transforms, may be examples of linear functions of applied voltages.

It is understood that applied voltages and electric field measurements may be time-varying. The linear transformations M and C may generally be time-invariant, i.e. may not be functions of time. However, M and C may vary or may be varied with time, e.g. due to geometric changes in conductor locations. Real-time updating of the relationship between applied voltages and electric field measurements may be possible in recalibration processes.

When r=n (or m=n, when r=m as noted above), $M=C^{-1}$, and the linear transformations M and C form, respectively, a completely determined system (1) and (2).

When r>n (or m>n when r=m as noted above), the matrix C may be related to M by a generalized inverse, e.g. the Moore-Penrose Generalized Inverse (MPGI), and the linear transformation C forms an overdetermined linear system (2) with more electric field measurements than applied voltages. In some embodiments, it may be advantageous to have overdetermined systems to achieve greater accuracy, even though these may incur greater computational cost. For example, overdetermined systems (r>n) may be achieved by taking multiple measurements.

In some cases, when the EF sensors may be configured to measure a single directional component of the electric field, or only a single direction component of the electric field is considered at each point, r=m. A single directional component may be considered when the variation in, or magnitude of, the electric field in a first direction is much greater than that in orthogonal direction(s) thereto, e.g. 10 times greater or more than 10 times greater.

In some cases, the electric field measurements may be linearly filtered to improve accuracy. For example, the electric field measurements may be filtered to the fundamental or dominant frequency. For example, $\vec{e}$ may be specified as follows $$\vec{e} = F_{\omega_0}(\vec{e}) \quad (3)$$

where $F_a(\cdot)$; is the Fourier transform with frequency component a, and $\omega_0$ is a fundamental frequency (e.g. 60 Hz).

In some cases, an overdetermined linear system may be achieved by relating different classes of voltages or electric field measurements, under the assumption that M and/or C do not vary between the different classes. Different classes of quantities may include quantities sampled at different instances of time, or quantities averaged over different averaging or sampling windows. In particular, an overdetermined linear system may be achieved by relating applied voltages in the power line to different classes of electric field measurements.

The values of the coefficients of M and C may be determined by modelling. However, accurate modelling may be difficult or impossible, e.g. the geometry of the conductors may need to be specified in detail and aspects of the environment affecting the electric field, such as buildings and air humidity, may need to be modelled. In some cases, it may be difficult to a priori account for changes to the geometry and aspects of the environment having a bearing on the electric field. Frequently, modelling involves greater computational cost.

It is found that voltages in transmission lines may be estimated based on measurements of electric fields using a linear transformation C that is specified by numerically estimating the coefficients $C_{ij}$ of the linear transformation C without detailed geometric modelling. Such an estimation of the linear transformation C may be achieved using calibration data, e.g. calibration voltages and corresponding electric field measurements.

In various embodiments, the calibration voltages need not refer to actual voltages but refer to an assumed constraint on voltages, e.g. a predetermined phase relationship between the voltages. For example, for a three-phase system, three electrical lines may be provided with substantially equally rated voltage but out-of-phase 120° with respect to each other. Since such calibration voltages are only determined up to a multiplicative constant (i.e. up to the magnitude of the phasors defining the calibration voltages), the resulting computed voltage may be determined only up to a multiplicative constant. However, in many cases, only the relative change of voltage in the power lines may be relevant for achieving monitoring of voltages, e.g. as specified in terms of percentages, and as such the absolute value of the voltages may be assumed to be equal to the rated voltage, unity, or any other constant.

If there are three independent sets of voltage measurements and three associated electric field measurements then the three independent sets of voltages may provide a direct way to determine the columns M, since each may be applying one volt to one conductor at a time. Subsequently C may be calculated by inverting M. However, such an approach requires control of voltages, which may have limited or no feasibility in real power delivery systems, where interruptions of the three-phase power supply state are prohibitive.

Aspects disclosed herein advantageously allow "online" or "real-time" calibration, e.g. in response to one or more triggers, without requiring cost prohibitive interruptions of the three-phase power supply.

In particular, it is found that in some cases, the $C_{ij}$ may be determined using a search algorithm configured to reduce a residual that measures how accurately the linear transformation C relates the calibration voltages to the electric field measurements. The search for the coefficients may be made more efficient by imposing constraints reducing the search space. It is found that heuristic and/or trial-and-error search, and specifically using genetic algorithms, may be particularly advantageous.

As described later, after the coefficients are determined using a processor, the linear system in equation (2) may be used to compute voltages continuously or automatically to be then provided to a terminal or user to facilitate monitoring of electrical power lines. The processor may be able to automatically, adaptively, and/or in response to a trigger (recalibration condition), repeat determination of the coefficients, e.g. to account for changes to geometry and environment around and relating to the electric field sensors and the power lines, since detailed physical modelling is not required.

Voltages in electrical power lines may be determined from electric field measurements in a computationally efficient manner. Real-time or online monitoring of voltages may be possible because of computationally efficiency of the methods and systems described herein, and also because of the ability to (re-)calibrate on-demand and/or according to prevalent conditions. The use of electric field sensors may allow remote monitoring and low-cost deployment and maintenance. In some cases, increased safety may be achieved due to non-contact of sensors with the power lines.

Aspects of various embodiments are now described in relation to the figures.

FIG. 1 is a perspective view of a plurality of electric field (EF) sensors 104A, 104B in the presence of power lines 102A, 102B in accordance with an embodiment.

The power lines 102A, 102B may generate respective electric fields 106A, 106B with strength weakening with distance away from the power lines 102A, 102B. A composite or total electric field 106 may result at least partially due to the superposition of electric fields 106A, 106B. Other sources of electric fields or things that modify electric fields may contribute towards the composite electric field 106. For example, in various embodiments, other electrical equipment in the general vicinity of the power lines 102A, 102B may influence the electric field 106.

An electric field (EF) sensor may sense a difference in electric potential or voltage between two points in space or any other electrical medium, which can be a low-conductive and low-loss dielectric gaseous medium such as air. An EFS typically senses the electric field within its sensor element's body wherever it is physically located, and not remotely. Except for locally to the volume it occupies, an electric field sensor does not practically disrupt the global electric field distribution of the electrical system it is probing. An EF sensor may produce a signal whose magnitude is substantially instantaneously proportional to the potential difference between said two points when the physical probe constituting the body of the EFS is not present and which therefore constitutes an electric field measurement. A voltage sensor may be utilized as an EF sensor if one or both of said two equipotential surfaces is/are electrically floating and if its probing body geometry is designed appropriately.

Electric field measurements may not require contact with conductors and therefore installations may be flexible and may not require formation of solid bridges between high-voltage conductors. Advantageously, electric field sensors may be smaller and lighter than voltage sensors requiring contact with power lines. Installation and change of installation may be simpler and effort of installation may be mitigated relative to voltage sensors. Modern electric field sensor technology may provide better linearity and wideband performance than legacy voltage sensors, e.g., inductive transformers that are commonly found permanently installed on the grid.

In some embodiments, electric field sensor readings may be combined with existing legacy voltage sensor readings to provide redundancy/resiliency as well as mutual performance extension. For example, legacy voltage sensors may provide accurate electric field sensor voltage determination and electric field sensor voltage readings may reciprocate by effectively extending or correcting the linearity and bandwidth of the legacy voltage sensor readings, e.g. by facilitating recalibration.

The EF sensors 104A, 104B placed generally in the vicinity around, including remotely from, the power lines 102A, 102B may be configured to measure the electric field 106 at different spatial points. For example, the EF sensors 104A, 104B may be optical sensors.

The distance, or a directional (e.g. x-component) of a separation vector, between the EF sensors 104A, 104B and the power line 102A may be respectively denoted $d_{AA}$, $d_{BA}$. Similarly, The distance, or a directional (e.g. x-component) of a separation vector, between the EF sensors 104A, 104B and the power line 102B may be respectively denoted $d_{AB}$, $d_{BB}$.

The EF sensors 104A, 104B may be connected to a data acquisition unit 108. The data acquisition unit 108 may be connected to a processor 110. The processor 110 may generate output 112 based on electric field measurements. In some embodiments, the EF sensors 104A, 104B may be connected directly to the processor 110.

"Connected" may refer to direct or indirect coupling or connection. "Connected" may refer to wired or wireless coupling or connected. In various embodiments, "connected" may refer to a one-way and/or two-way transfer of information or data along between connected integers.

The EF sensors 104A, 104B may measure (at least) an x-components of the electric field 106, respectively denoted $e_{x,1}$ and $e_{x,2}$. Based on the system (1) and (2), $e_{x,1}$ and $e_{x,2}$. may be related to voltages in the power lines 102A, 102B, respectively denoted $v_1$ and $v_2$, using $$e_{x,1}=M_{11}v_1+M_{12}v_2 \quad (4)$$

and $$e_{x,2}=M_{21}v_1+M_{22}v_2 \quad (5).$$

As a result, the system may be expressed as follows $$\vec{e} = \begin{pmatrix} e_{x,1} \\ e_{x,2} \end{pmatrix} = M \begin{pmatrix} v_1 \\ v_2 \end{pmatrix} = M\vec{v} \quad (6)$$

In this case, coefficients of the linear transformation M may be unknown. However, certain constraints may be placed on the coefficients.

The measurements obtained from the electric field sensors 104A, 104B may be phase-shifted relative to the voltages in the power lines. It is understood that $e_{x,1}$ and $e_{x,2}$. may be phase-shifted, e.g. by multiplication by a factor $e^{i\alpha}$. In general, $e_{x,1}$, $e_{x,2}$, $v_1$, and $v_2$ may be complex numbers (phasors).

The magnitude of the coefficients $M_{ij}$ may be constrained relative to each other based on the relative importance (influence or contribution) of a particular power line to the electric field measured at a point. For example, a power line further away from the point may have weaker contribution or weaker normalized contribution (contribution per volt in the power line) relative to a power line that is closer to the point. If $d_{AA}<d_{AB}$, we may restrict the magnitude of the first row of coefficients of M as follows $$M_{11}>M_{12} \quad (7)$$

and if $d_{BB}<d_{BA}$, we may restrict the magnitude of the second row of coefficients of M as follows $$M_{22}>M_{21} \quad (8).$$

In general, it is found that that the coefficients of M may vary as follows $$\frac{M_{12}}{M_{11}} \sim \left(\frac{d_{AA}}{d_{AB}}\right)^{\lambda_a}, \frac{M_{21}}{M_{22}} \sim \left(\frac{d_{BB}}{d_{BA}}\right)^{\lambda_b} \quad (9)$$

where $\lambda_a$ and $\lambda_b$ may depend on the geometry of the conductors (power lines) relative to the electric field sensors.

In some embodiments, the coefficients $M_{ij}$ may be constrained to be real, based on physical considerations. For example, if the conductors are metal and the space surrounding the metal is filled with air.

In various embodiments, the EF sensors 104A, 104B may be positioned to realize constraints on the linear transformation M and/or C. This is found to be particularly advantageous, as constraints are found to reduce the computational cost of determining coefficients, e.g. by search methods, such as genetic algorithms.

For example, in some cases, the EF sensors 104A, 104B may be positioned symmetrically such that the relationship between the power lines 102A, 102B and one of the EF sensors 104A, 104B may be the same as or similar to the relationship with another one of the EF sensors 104A, 104B, up to a re-labelling of the power lines 102A, 102B. This may lead to a diagonally symmetry of the matrix M. Advantageously, under a constraint of diagonal symmetry, the computational cost of computing coefficients of M may be significant reduced.

For example, positioning of the electric field sensors 104A, 104B such that $d_{AB}=d_{BA}$ may lead to a symmetry constraint: $M=M^*=M^T$. Further constraining $d_{AA}=d_{BB}$ may lead to $M_{11}=M_{22}$.

In some embodiments, positioning of sensors may not facilitate imposing constraints on M.

It is understood that the constraints may be generalized when there are n>2 conductors (power lines), and/or for m=n electric field sensors. In particular, in three-phase systems, three power lines (other than a ground line) of the three-phase system may be associated with three electric field sensors.

If $d_{\alpha\beta}<d_{\alpha\mu}$, for some β, μ is satisfied, where $d_{ab}$ is the distance between the a-th electric field sensor and the b-th power line, the constraint $M_{\alpha\beta}>M_{\alpha\mu}$ for those β, μ may be applied or enforced. Thus, the spacings $d_{\alpha\beta}$ may define an order an order $d_{\alpha\beta}<d_{\alpha\mu}$, for all the appropriate β, μ on the power lines associated with the a-th electric field sensor. This order on the spacings may then be associated with the constraint $M_{\alpha\beta}>M_{\alpha\mu}$ for all the appropriate β, μ, which may then be applied or enforced. Note: in cases where an electric field sensor may be equidistant from two or more conductors, a constraint may specify equating the associated coefficients.

As an example, for a 3-conductor, 3-EF sensor case, suppose the first electric field sensor is positioned relative to the first, second, and third conductors such that $d_{11}<d_{12}<d_{13}$, then the following constraint may be applied $$M_{11}>M_{12}>M_{13} \quad (10).$$

Similarly, suppose the second electric field sensor is positioned such that $d_{22}<d_{21}=d_{23}$, then the following constraint may be applied $$M_{22}>M_{21}=M_{23}. \quad (11).$$

Finally, if the third electric field sensor is positioned such that $d_{33}<d_{32}<d_{31}$, then the following constraint may be applied $$M_{33}>M_{32}>M_{31} \quad (12).$$

A symmetry constraint may be formulated based on the distances between electric field sensors and conductors. If the distance between the α-th electric field sensor and the β-th power line (or conductor) is substantially equal to the distance between the β-th electric field sensor and the α-th power line (or conductor), e.g. $d_{\alpha\beta}=d_{\alpha\mu}$, then the symmetry constraint $M=M^*=M^T$ (or $C=C^*=C^T$) may be applied.

It is understood that at least some of the constraints may be at least partially generalized when the number of conductors n is not equal to the number of electric field sensors m.

It is understood that symmetry constraints may assume and/or require that the electric field sensors are oriented so as to allow symmetry constraints to be formulated. For example, the electric field sensors may all be oriented such that they face their respective closest conductor or may be generally oriented towards a space occupied by the conductors.

For overdetermined systems, while the symmetry constraint may generally not be possible, partial symmetry may be applied in certain instances, i.e. $C=(C_A \; C_B)$ where $C_A$ is symmetric (or Hermitian).

It is understood that constraints on M may be converted to constraints on C and vice-versa, in some cases, e.g. where m=n (as shown in FIG. 1), then $C=M^{-1}$.

Using constraints as described above in restraining the coefficients may be advantageous compared to detailed modelling of the physics and geometry (or constraining the coefficients based on detailed geometric modelling). The constraints may remain valid under changes where the modelling may be invalid. A significant enough change of the environment and/or geometry of the power lines relative to each other and the electric field sensors may yield unacceptably high modelling errors, yet the constraints (such as distances between electric field sensors and conductors) may be remain strictly valid. For example, if a large object influencing the electric field is placed near the conductors, the modelling may yield erroneous result, even though the constraints mentioned above may remain unchanged. Advantageously, the coefficients may be re-calibrated efficiently under such constraints to achieve accurate conversion of electric field measurements to quantities indicative of voltages.

Figure 2B:
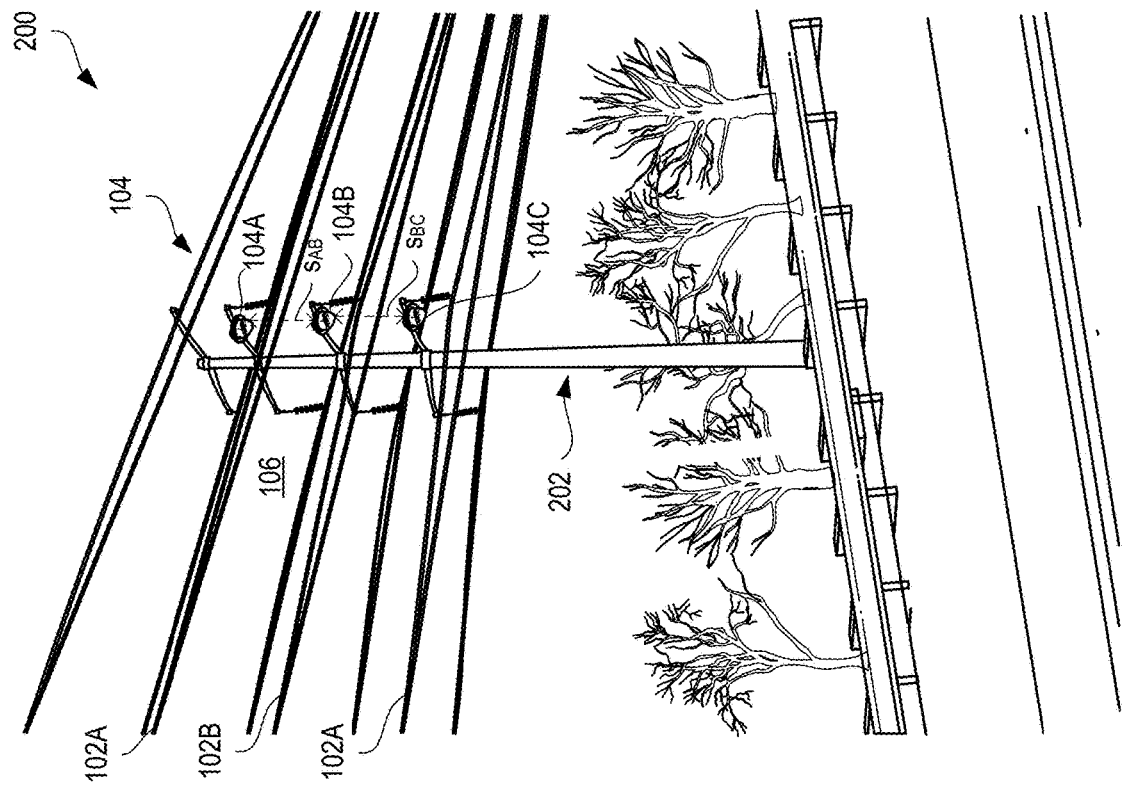
FIG. 2B is a perspective view of another power transmission tower of a polyphase system with electric field sensors mounted thereon, in accordance with another embodiment.
Figure 2A:
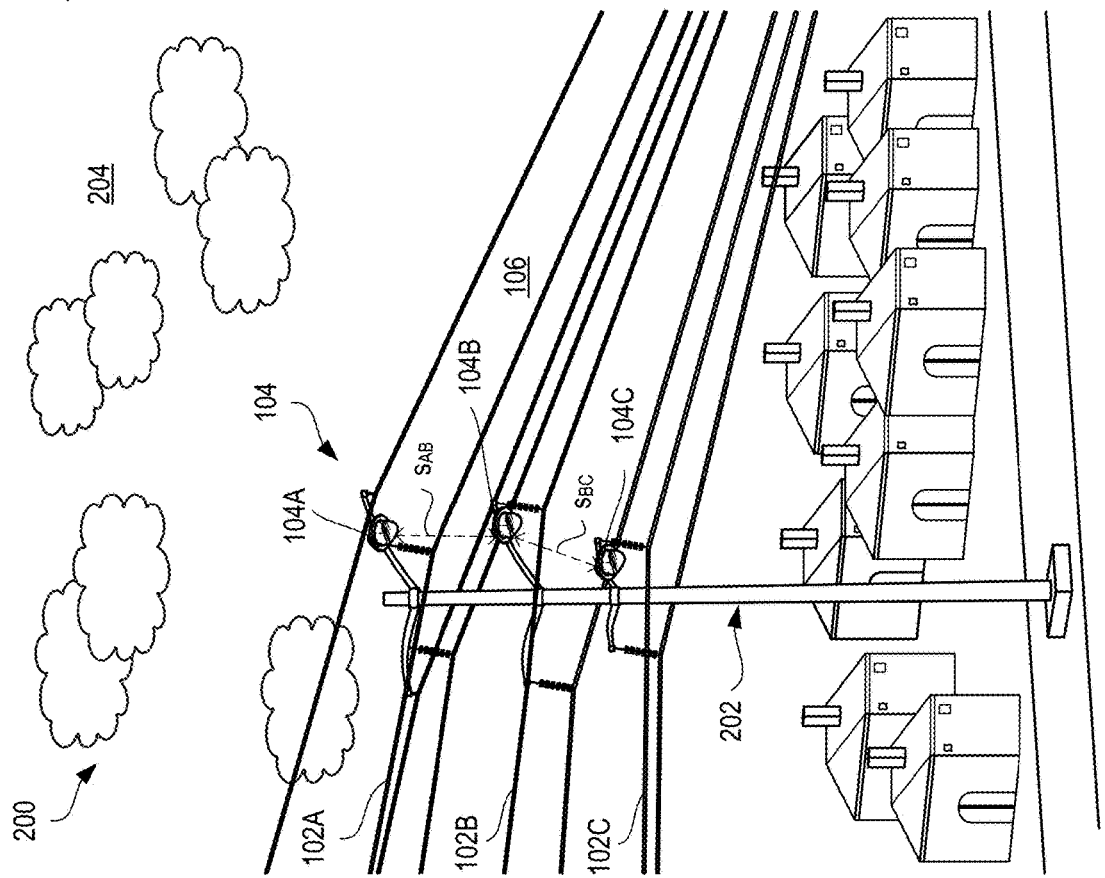
FIG. 2A is a perspective view of a power transmission tower of a polyphase system with electric field sensors mounted thereon, in accordance with an embodiment.

FIG. 2A is a perspective view of a power transmission tower 202 of a polyphase system 200 with a plurality of EF sensors 104 mounted thereon, in accordance with an embodiment.

FIG. 2B is a perspective view of another power transmission tower 202 of a polyphase system 200 with a plurality of EF sensors 104 mounted thereon, in accordance with another embodiment.

The polyphase system 200 may be three-phase system including three power lines 102A, 102B, 102C, and a ground conductor in an open-air environment 204.

An EF sensor 104A may be spaced apart by a distance $s_{AB}$ from an EF sensor 104B and an EF sensor 104B may be spaced apart by a distance $s_{BC}$ from an EF sensor 104C.

Each of the three power lines 102A, 102B, 102C may have opposing power lines, which may influence the electric field 106.

The environment 204, and objects in the vicinity of the power towers 202 may influence the electric field 106.

In FIG. 2A, the EF sensors 104A, 104B, 104C may be spaced apart in at least two non-parallel directions (horizontal and vertical), whereas in FIG. 2B, the EF sensors may be spaced apart in a single direction (vertical).

Figure 2C:
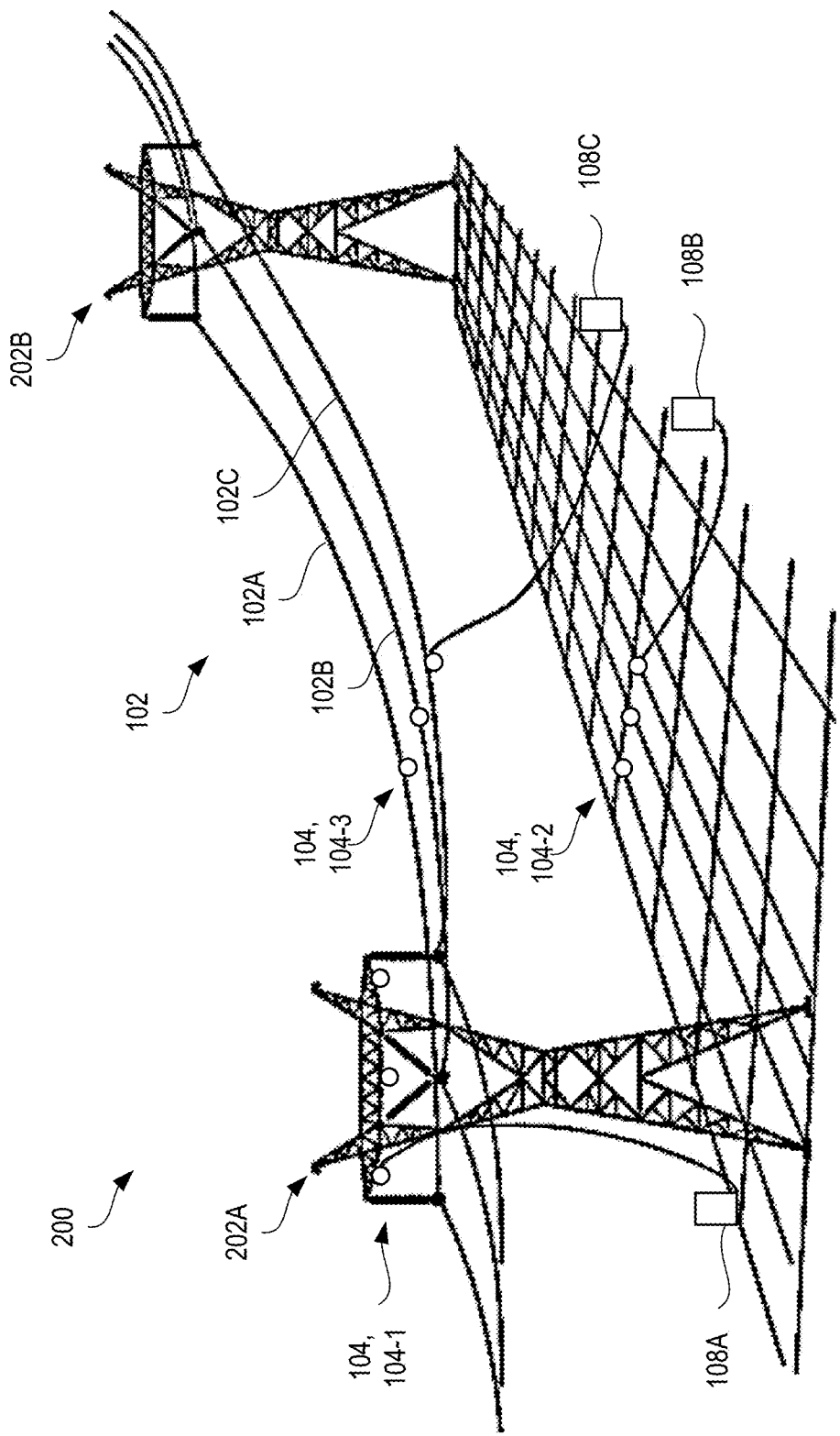
FIG. 2C is a perspective view of a plurality of power transmission towers for supporting a plurality of power lines and electric field sensors installed to measure voltages in the plurality of power lines, in accordance with an embodiment.

FIG. 2C is a perspective view of a plurality of power transmission towers 202A, 202B for supporting a plurality of power lines 102 and electric field sensors 104 installed to measure voltages in the plurality of power lines 102, in accordance with an embodiment.

A first group 104-1 of three of the plurality of electric field sensors 104 may be mounted on the power transmission tower 202A to, correspondingly, face the power lines 102A, 102B, 102C. The group 104-1 may be connected to a first data acquisition unit 108A.

A second group 104-2 of three of the plurality of electric field sensors 104 may be placed on the ground or proximal thereto (e.g. mounted on a holder or a fixture placed on the ground) to, correspondingly, face the power lines 102A, 102B, 102C. The group 104-2 may be connected to a second data acquisition unit 108B.

A third group 104-3 of three of the plurality of electric field sensors 104 may be mounted on or proximal to the three power lines 102A, 102B, 102C to, correspondingly, face the power lines 102A, 102B, 102C. In some embodiments, the plurality of electric field sensors 104 may be substantially touching or spaced apart but very close to touching the corresponding power lines 102A, 102B, 102C. The group 104-3 may be connected to a third data acquisition unit 108C.

Each of the electric field sensors in each of the groups 104-1, 104-2, 104-3 may be positioned adjacent to, or facing, a corresponding one of the power lines 102A, 102B, 102C of the plurality of power lines 102.

In some embodiments, only one, or two, of the groups 104-1, 104-2, 104-3 may be included or deployed.

In various embodiments, similar, same, or different linear transformation may be used to determine voltages in the electrical power lines 102A, 102B, 102C based on measured electric field for each of the groups 104-1, 104-2, 104-3.

The plurality of electric field sensors 104 may be optical sensors positioned remotely from the power lines 102 to measure a far-field of the electric field 106, e.g. the electric field 106 measured by the electric field sensors in the group 104-1 and/or the group 104-2 may be configured to measure a far-field (or field from a far location) of the electric field 106. In some cases, the electric field sensors in the group 104-3 may be positioned in the near-field in the electric field 106.

Figure 3:
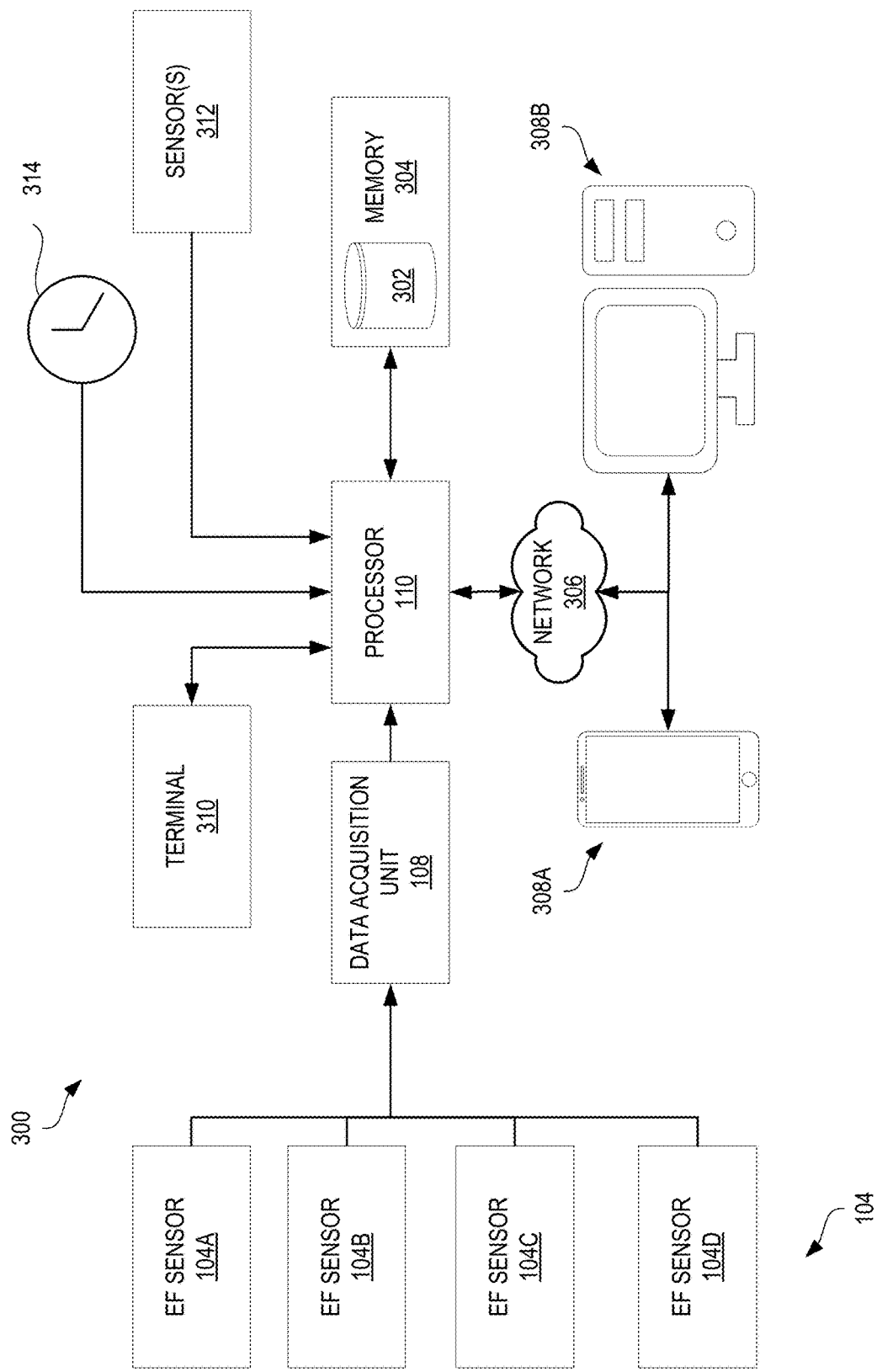
FIG. 3 is a block diagram of a system for monitoring of power lines of a polyphase power system, in accordance with an embodiment.

FIG. 3 is a block diagram of a system 300 for monitoring of a plurality of power lines 102 of a polyphase power system 200, in accordance with an embodiment.

A plurality of electric field sensors 104 positioned to measure an electric field 106 around a portion of the power lines 102, e.g. a portion shown in FIGS. 2A-2B. The electric field sensors 104A, 104B, 104C, 104D may be connected to a processor 110 via a data acquisition unit 108.

A computer-readable memory 304 may be connected to the processor 110. A terminal 310 may be connected to the processor 110. A computer-readable memory 304 may store processor-executable instructions 302 that, when executed, configure the processor 110 to cause or execute steps of one or more methods. In various embodiments, the computer-readable memory 304 may be transitory or non-transitory.

One or more client devices 308A, 308B may be used to monitor the power lines 102, including monitoring voltages thereof, and/or provide input to the processor 110.

In some embodiments, a network 306 may couple client devices 308A, 308B to the processor 110. Example client devices 308A, 308B may include handheld devices, workstations, and/or other devices for monitoring the power lines 102.

One or more sensor(s) 312 may be connected to the processor 110. In various embodiments, the sensor(s) 312 may provide environmental data or weather data. For example, sensor(s) 312 may indicate a temperature, relative humidity, and/or a measure of precipitation or other environmental conditions that are influence electric fields and/or the relationship between electric fields and voltage (the M and C noted above).

In various embodiments, user input may be provided to the processor 110 via the terminal 310 and/or the client devices 308A, 308B.

A time unit 314, which may be a timer and/or a clock, may be connected to the processor 110.

In some embodiments, the processor 110 may determine a recalibration condition indicative of at least one of a time, a sensed environmental condition, or a user input.

For example, the processor 110 may use input from the time unit 314 to determine a time elapsed since (re)calibration or if a predetermined time for (re)calibration has been arrived or passed.

For example, the processor 110 may use input from the sensor(s) 312 to determine if an environmental condition affecting M or C, such as high winds, high relative humidity, presence of ice, high precipitation, or low (e.g. freezing) temperatures, has been sensed or detected. In some embodiments, a sensed environmental condition may include an environmental condition provided by a separate system for detecting environmental conditions.

In various embodiments, the system 300 may allow retaining long-term calibration (calibration for a prolonged period of time) by recalibration over time as (sensed) environmental conditions change (rain, snow, thermal expansion/contractions) such that the device accuracy remains high. Environmental conditions may include single individual events (such ask faults on a phase, or single-phase switching/reclosing) which may naturally happen over time. Environmental conditions may include loss of power in the power lines and/or re-energization of the power lines after such a loss of power in the power lines.

For example, the processor 110 may use a user input to determine if a fault has been detected, if aspects of power sources and/or sinks connected to the system 300 (or the polyphase system 200) have changed, or another condition affecting M or C has occurred.

In some embodiments, user input may include input provided another system, e.g. a fault detection system.

In some embodiments, the processor 110 may update, in response to the recalibration condition, data indicative of coefficients ($M_{ij}$ or $C_{ij}$) of the linear transformation (M or C, respectively).

The linear transformation may relate a first plurality of electric field measurements received from the plurality of electric field sensors 104, to calibration voltages $\vec{v}_{calibration}$ of the power lines 102, e.g. in accordance with an equation similar to equations (1) and/or (2).

In various embodiments, electric field measurements may refer to outputs of electric field sensors 104 and/or directional components thereof.

In some embodiments, the calibration voltages may be known quantities, e.g. as determined by a separate calibration measurement of voltages.

Advantageously, in some embodiments the calibration voltages $\vec{v}_{calibration}$, may be based on a priori knowledge or assumptions.

In some embodiments, for updating, the processor 110 may determine the calibration voltages $\vec{v}_{calibration}$ based on a predetermined phase relationship of voltages in the power lines. For example, for a three-phase system, the voltages in the power lines may be symmetrically out-of-phase with each other by a phase offset or phase factor of 120°. The calibration voltage $\vec{v}_{calibration}$ may then generally be assumed to be proportional to the following expression representing a vector of unit magnitude having components out-of-phase with each other by 120°

$$\frac{1}{\sqrt{3}}\begin{pmatrix} 1 \\ e^{i\left(\frac{2\pi}{3}\right)} \\ e^{i\left(\frac{4\pi}{3}\right)} \end{pmatrix}.$$

As a result, the calibration voltages may be indicative of, under scaling by a non-unit factor, the voltages in the power lines. The non-unit factor may be scalar and may correspond to the actual magnitude of the voltages (e.g. the true value of $\sqrt{v_1^2+v_2^2+v_3^2}$). Using such a calibration voltage in the methods and systems disclosed herein may yield linear transformation that may allows estimation of true voltages up to multiplication by the non-unit factor.

Advantageously, knowledge of the magnitude of the voltages is not necessary to determine at least relative changes in voltages, e.g. in terms of percentages. This may be particularly useful because the phase relationship between power lines of a polyphase system 200 may be significantly more reliably predictable or specified compared to the actual magnitude of the voltages. For example, increased power generation in a power source connected to the polyphase 200 may cause change in voltage magnitudes but may leave the relative phase unchanged.

Nevertheless, the magnitudes of the estimated voltages may be brought closer to their true values by assuming that the voltage magnitude is equal to the rated power. For example, for a three-phase system, the calibration voltage $\vec{v}_{calibration}$ may then generally be assumed to be equal to the following expression representing a vector having components out-of-phase with each other by 120° and of magnitude equal to the rated power $|V_{rated}|$ $$\frac{|V_{rated}|}{\sqrt{3}}\begin{pmatrix} 1 \\ e^{i\left(\frac{2\pi}{3}\right)} \\ e^{i\left(\frac{4\pi}{3}\right)} \end{pmatrix}.$$

Data indicative of the coefficients may be data indicative of an estimate or an approximation $C_{(k)}$ of C (or $M_{(k)}$ of M), where k≥0 may be an iteration number of a search or optimization algorithm, such that updating the data in accordance with the search or optimization algorithm may involve performing the following update (in accordance with a mapping or rule, deterministic or stochastic)

$$C_{(k)} \to C_{(k+1)} \quad (13)$$

or $$M_{(k)} \to M_{(k+1)} \quad (14)$$

In some embodiments, updating the data may include updating an initial guess, say $C_{(0)}$, and/or a previously updated matrix C.

In some embodiments, the initial guess $C_{(0)}$ may be chosen randomly or stochastically, e.g. by choosing its entries using a pseudorandom generator, and may chosen to be or may be made to be compliant with one or more of the constraints described previously.

In some embodiments, the initial guess $C_{(0)}$ may be chosen based on a previously determined C, an educated guess, or an additional assumption (e.g. an ansatz).

In some embodiments, iterative searches with progressive adjustments of search boundaries may be based on the determinations of C or M of the former iterations, where one or more iterations start with progressively approximating upper and lower bounds for the typically dominant diagonal elements (presuming EF sensor-to-conductor numerical indexing symmetry), followed by similarly improving upper and lower bounds of off-diagonal elements with every completed approximate search iteration.

For example, a good initial guess on the bounds or constraints (for a heuristic search) may be to approximate M as purely diagonal, for EF sensors on the ground similarly facing the power lines and perpendicularly to the ground plane, and may be to use the highest of the magnitudes of the three EF sensor readings (so this is an input after installation and while three-phase voltage is on) times some factor around 2 as the maximum allowed value for the diagonal elements and the value 0 as the minimum, since it cannot be less than 0 for any positive voltage for a given mutually consistent polarity of the EF sensors on the ground facing the power lines.

Estimated calibration voltages $\vec{v}_{(q)}$ for q=0,1, . . . , k, k+1 may be determined based on the data indicative of the coefficients of the linear transformation (e.g. data indicative of $M_q$ and/or $C_q$) and calibration data indicative of the first plurality of electric field measurements (e.g. data indicative of $\vec{e}$)

$$\vec{v}_{(q)} = C_{(q)}\vec{e} \text{ where } q=0,1,\ldots,k,k+1 \quad (15)$$

The updating, e.g. as shown in equations (13) and (14), may be based on a residual indicative of a deviation of the calibration voltages from estimated calibration voltages.

In various embodiments, a residual may be given by a metric distance between calibration voltages $\vec{v}_{calibration}$ and estimated calibration voltages $\vec{v}_{(q)}$. For example, the residual may be given by the Euclidean norm $$\|\vec{v}_{(q)} - \vec{v}_{calibration}\| \quad (16)$$

In some embodiments, a residual may be given by a Euclidean norm of a vector having components as angles between components of the calibration voltages $\vec{v}_{calibration}$ and corresponding components of the estimated calibration voltages $\vec{v}_{(q)}$, where the angle between two complex numbers a and b is given by $$a \angle b = \operatorname{atan}\left(\frac{imag(a/b)}{real(a/b)}\right). \quad (17)$$

It is understood that other aspects may be included in the residual. These may be weighted.

It is understood that, in some cases, the updating may be based on other quantities that are indicative of the residual even though the updating may not be directly based on the residual, e.g. to effectively reduce the residual based on genetic programming.

In various embodiments, the updating may be effected if the residual is above a threshold e or may otherwise not be effected. The updating may be configured to reduce the residual.

In various embodiments, the updating may include updating iteratively, e.g. until an iteration q=K such that $$\text{residual} < \epsilon \text{ when } C_{(q)} = C_{(K)} \tag{18}$$

In some embodiments, the updating may be effected in accordance with a genetic algorithm, i.e. by genetic programming.

Genetic programming (GP) may generally refer to a technique of evolving a population of candidate solutions, e.g. a population of $C_{(q)}$ for a given q, towards an increasing heuristic "genetic fitness". The candidate solutions may be fit for a particular task by selection of the "fittest" solutions for reproduction (crossover) and mutation. Fitness may be determined by means of a predefined fitness function, e.g. a lower residual candidate solution may be associated with higher fitness.

The crossover operation may involve swapping random parts of selected pairs (parents) of candidate solutions of a current generation of solutions to produce new and different candidate solutions that become part of a next generation of solutions (offspring).

Mutation may involve substitution of some random part of a first candidate solution with some other random part of a second candidate solution. In various embodiments, random parts may include quantities indicative of one or more coefficients of the linear transformation.

Some candidate solutions not selected for reproduction may be copied from the current generation to the next generation. Selection and crossover, and/or other operations analogous to natural genetic processes, may then be recursively applied to the next generation of programs.

The members of the next generation may be on average more fit than the members of the current generation, and the best-of-generation solution may be often better than the best-of-generation solution from previous generations. The recursion may be terminated when some individual program reaches a predefined proficiency or fitness level, which may be associated with the residual.

In various embodiments, constraints may be included in genetic programming. In various embodiments, constraining coefficients based on a constraint may include strict and/or non-strict constraints. Examples of non-strict constraints may include applying a constraint by penalizing non-compliance with a constraint via a modified residual that increases when a constraint is not complied with and/or fitness function that yield greater fitness for candidate solutions that satisfy a constraint and/or that are closer to satisfying one or more constraints.

It is found that genetic programming is particularly effective and advantageous for estimating the linear transformation. For example, relative to some other approaches, it is found to be computationally efficient.

In some embodiments, for updating, the processor 110 may constrain a portion of the coefficients of the linear transformation to be ordered based on an order associated with a particular electric field sensor. In various embodiments, such an order may be an order on the power lines associated with the particular electric field sensor, e.g. an ordering of the spacings (e.g. $d_{ab}$ described above) between the particular electric field sensor and each of the associated power lines. It is understood that all of the power lines may be associated with each of the electric field sensors.

In various embodiments, the portion of the coefficients may be associated with the particular electric field sensor as described previously, e.g. as a row of M or corresponding portion of C.

In some embodiments, for updating, the processor 110 may constrain the coefficients to be real numbers.

If the medium surround the power lines is substantially dielectric (negligible dissipation in dipole movement) and the conductors are substantially conductive (negligible dissipation in electron flow) with dielectric constant and conductivity substantially independent of voltage, then for sinusoidal voltages, the directional components of electric field are sinusoidal everywhere with a phase that is independent of frequency, and the elements of M are real constants with the elements of applied voltages and electric field measurements represented as phasors (complex numbers).

This condition may typically be the case for the electric field permeating the air in an air insulated system (AIS) but away from water, ice, and other contamination that are electrically dissipative.

In some embodiments, the processor 110 may receive data indicative of a second plurality of electric field measurements from the plurality of electric field sensors 104.

In some embodiments, the processor 110 may determine estimated voltages using the data indicative of the coefficients of the linear transformation (M or C) and the data indicative of the second plurality of electric field measurements to provide monitoring of the power lines 102 of the polyphase power system 200.

In various embodiments, the processor-executable instructions, when executed, may further configure the processor to transmit, to the terminal 310, data indicative of the estimated voltages.

In various embodiments, the plurality of electric field sensors is indicative of a single directional component of the first plurality of electric field measurements, the single directional component being substantially lateral to the power lines.

Described above, are various aspects of monitoring power lines by determining voltages of the power lines using electric field measurements, e.g. by using optical sensors or non-contact sensors such as EF sensors described above. It is understood that monitoring power lines may also be achieved using, mutatis mutandis, the approach outlined above to determine currents (in place of voltage) in the power lines using magnetic field measurements (in place of electric field measurements), e.g., by using optical sensors non-contact sensors in place of the EF sensors described above.

For example, systems corresponding to (1) and (2) may be obtained to relate currents in the power lines to magnetic field measurements, i.e., a linear transformation relating currents to magnetic field measurements. Analogous symmetry constraints may also be formulated for such systems.

Figure 4:
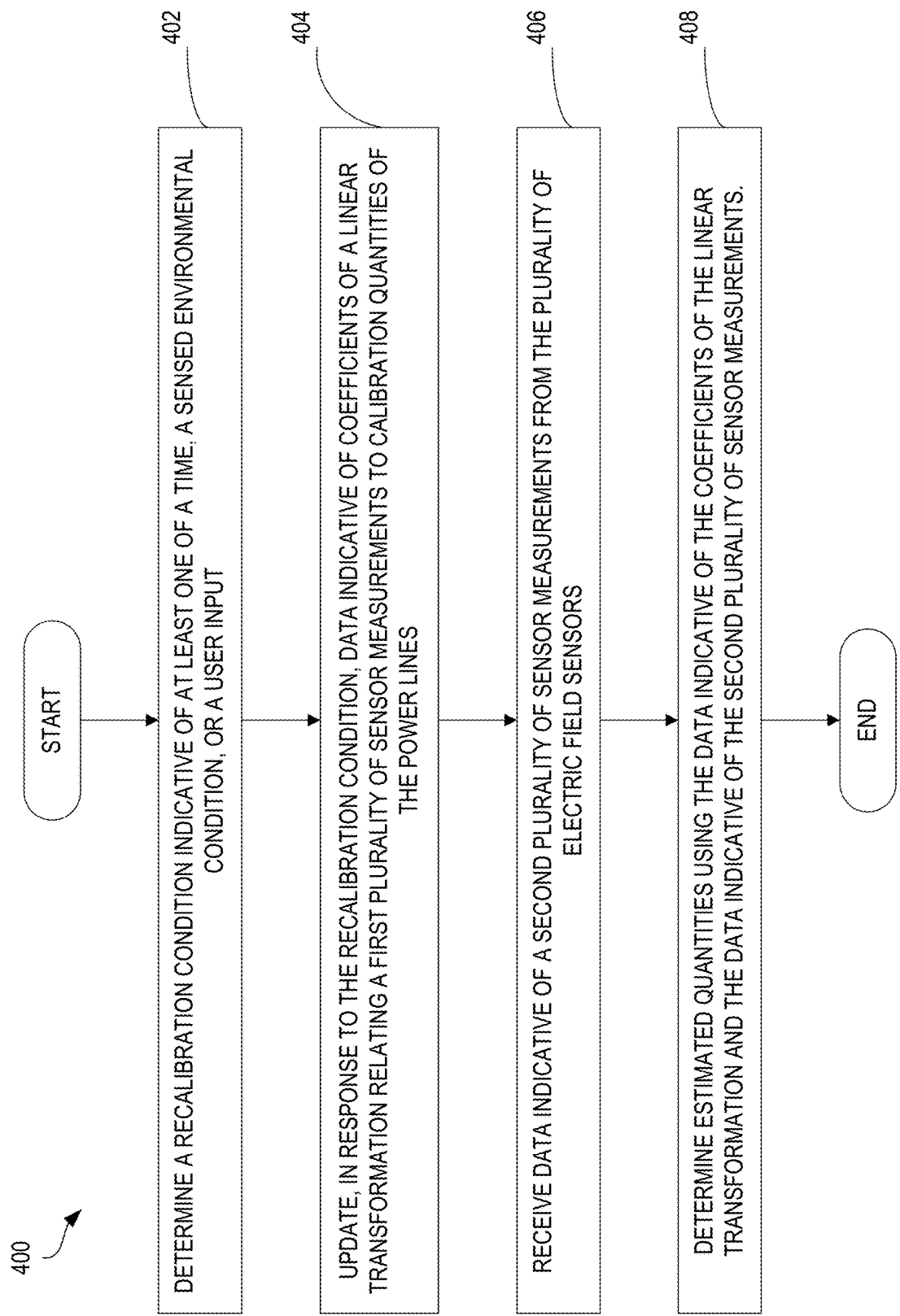
FIG. 4 is a flow chart of a computer-implemented method of adaptive, real-time monitoring of power lines of a polyphase power system, in accordance with an embodiment.

FIG. 4 is a flow chart of a computer-implemented method 400 of adaptive, real-time monitoring of power lines of a polyphase power system, in accordance with an embodiment.

Step 402 of the method 400 may include determining, by a processor, a recalibration condition indicative of at least one of a time, a sensed environmental condition, or a user input.

Step 404 of the method 400 may include updating, in response to the recalibration condition, data indicative of coefficients of a linear transformation relating a first plurality of sensor measurements to calibration quantities of the power lines.

In various embodiments of the method 400, the updating may be based on a residual indicative of a deviation of the calibration quantities from estimated calibration quantities.

The calibration quantities may be determined based on the linear transformation and the first plurality of sensor measurements. The first plurality of sensor measurements may be from a plurality of sensors positioned to measure a field around a portion of the power lines.

In some embodiments of the method 400, the pair of the plurality of sensors and the calibration quantities are selected from a group consisting of a first pair and a second pair, the first pair consisting of a plurality of electric field sensors and calibration voltages, the second pair consisting of a plurality of magnetic field sensors and calibration currents.

In some embodiments of the method 400, the first plurality of sensor measurements is a first plurality of electric field measurements, the calibration quantities are calibration voltages, the estimated calibration quantities are estimated calibration voltages, the plurality of sensors is a plurality of electric field sensors, and the field is an electric field.

In some embodiments of the method 400, the first plurality of sensor measurements is a first plurality of magnetic field measurements, the calibration quantities are calibration currents, the estimated calibration quantities are estimated calibration currents, the plurality of sensors is a plurality of magnetic field sensors, and the field is a magnetic field. In some embodiments of the method 400, the updating may include constraining the coefficients to be real numbers, as discussed previously in reference to $\vec{v}_{calibration}$.

In some embodiments of the method 400, the updating may include using a genetic algorithm to update the data indicative of the coefficients of the linear transformation, e.g. using the genetic algorithm to reduce the residual.

In some embodiments of the method 400, the updating may include filtering the first plurality of sensor measurements to remove non-fundamental frequency components. In various embodiments, filtering may include Fourier transforming, averaging, low-pass filtering, bandpass filtering, high-pass filtering, or non-causal filtering.

In some embodiments of the method 400, the updating may include determining the calibration voltages based on a predetermined phase relationship of voltages in the power lines, the calibration voltages being indicative of, under scaling by a non-unit factor, the voltages in the power lines, as described previously in reference to $\vec{v}_{calibration}$.

Step 406 of the method 400 may include receiving, by the processor, data indicative of a second plurality of sensor measurements from the plurality of sensors.

Step 408 of the method 400 may include determining, by the processor, estimated quantities using the linear transformation and the second plurality of sensor measurements.

In some embodiments, the method 400 may further comprise transmitting data indicative of the estimated quantities to provide monitoring of the portion of the power lines of the polyphase power system.

In some embodiments of the method 400, the plurality of sensors may be optical sensors positioned remotely from the power lines to measure a far-field of an electromagnetic field, e.g. an electric field or a magnetic field.

In some embodiments of the method 400, spacings (e.g. $d_{ab}$ above) between an electric field sensor of the plurality of electric field sensors and each of the power lines define an order on the power lines associated with the electric field sensor, and step (b) includes constraining a portion of the coefficients of the linear transformation to be ordered based on the order, the portion of the coefficients being associated with the electric field sensor.

In some embodiments of the method 400, the plurality of sensors may be positioned symmetrically relative to the power lines. In various such embodiments, the updating may include constraining the linear transformation to be a symmetric matrix (the symmetry constraint, described previously). For example, the positioning may be such that the spacings $d_{ab}=d_{ba}$, as described previously.

In some embodiments, the plurality of sensors may be positioned such that the linear transformation is rendered symmetric, e.g. with or without constraints on spacings $d_{ab}$ described previously.

In some embodiments of the method 400, the power lines are three power lines, and the plurality of sensors are three sensors, e.g. as may be in a three-phase system equipped with three electric field sensors.

In some embodiments of the method 400, a number of the plurality of sensors is greater than a number of power lines.

In some embodiments of the method 400, the linear transformation forms an overdetermined linear system relating the plurality of electric field measurements to the calibration voltages of the power lines.

In some embodiments of the method 400, the calibration quantities include quantities selected from a group consisting of sensed voltages being sensed using one or more voltage sensors separate from the plurality of sensors and sensed currents being sensed using one or more current sensors separate from the plurality of sensors. The one or more voltage sensors and the one or more current sensors being in contact with the power lines. For example, recalibration using legacy sensors and equipment may be achieved.

In various embodiments, the steps 402, 404, 406, 408 may be executed or performed by a processor.

Figure 5:
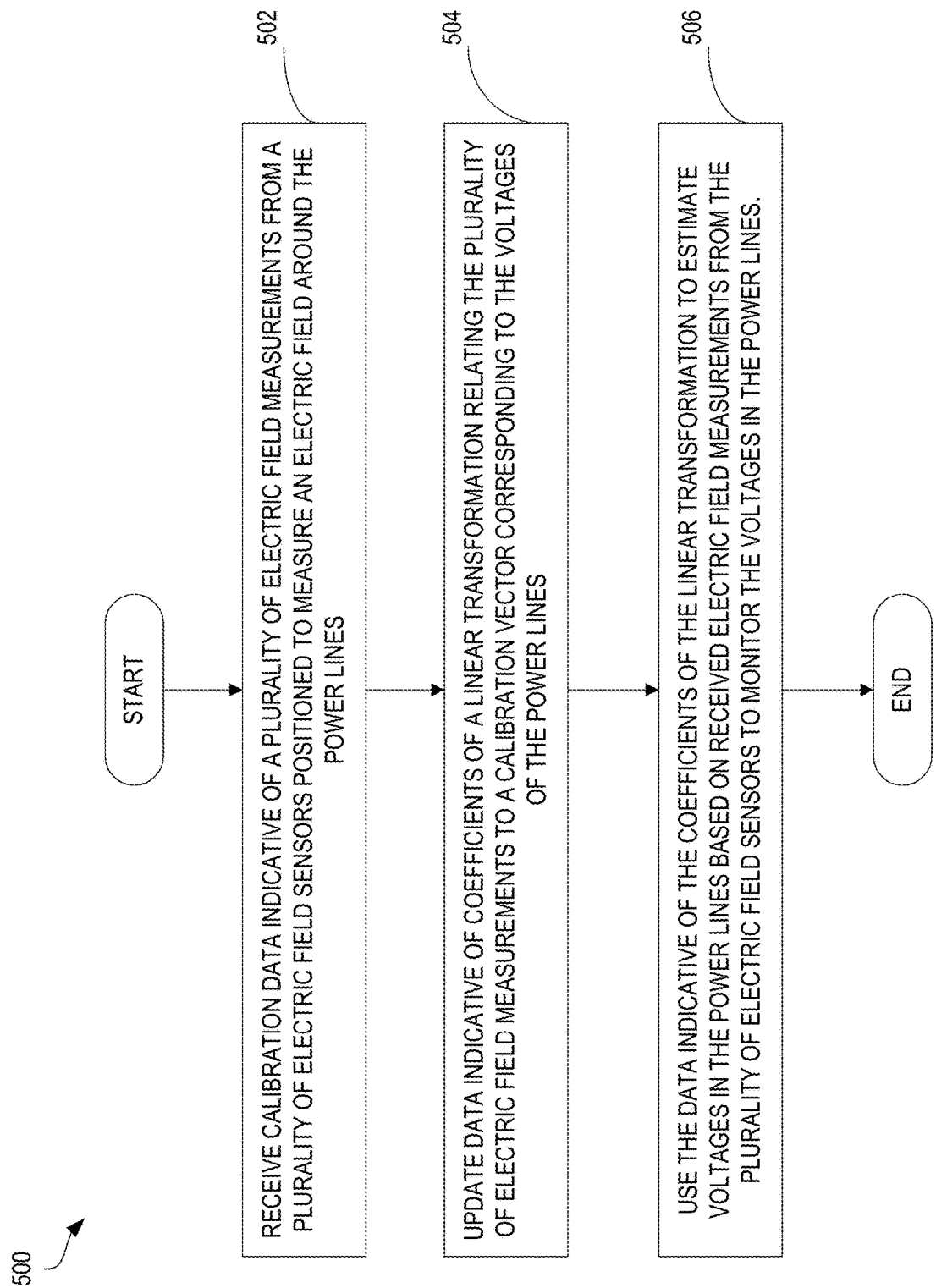
FIG. 5 is a flow chart of a computer-implemented method of monitoring of voltages in power lines of a polyphase power system, in accordance with an embodiment.

FIG. 5 is a flow chart of a computer-implemented method 500 of monitoring of voltages in power lines of a polyphase power system, in accordance with an embodiment.

Step 502 of the method 500 may include receiving, by a processor, calibration data indicative of a plurality of electric field measurements from a plurality of electric field sensors positioned to measure an electric field around the power lines.

Step 504 of the method 500 may include updating, by the processor, data indicative of coefficients of a linear transformation relating the plurality of electric field measurements to a calibration vector corresponding to the power lines. In some embodiments, components of the calibration vector may be defined by a predetermined phase relationship of the voltages in the power lines, e.g. as described previously in reference to $\vec{v}_{calibration}$. In some embodiments, components of the calibration vector may be provided or deduced based on rated voltage.

In some embodiments of the method 500, the updating may be based on a residual indicative of a deviation of the calibration vector from an estimated calibration vector. The calibration vector may be determined based on the linear transformation and the plurality of electric field measurements.

Step 506 of the method 500 may include using the data indicative of the coefficients of the linear transformation to estimate voltages in the power lines based on received electric field measurements from the plurality of electric field sensors to adaptively monitor the voltages in the power lines.

In various embodiments of the method 500, the linear transformation may form an overdetermined linear system relating the plurality of electric field measurements to the calibration vector.

In various embodiments, the steps 502, 504, 506 may be executed or performed by a processor.

Figure 6:
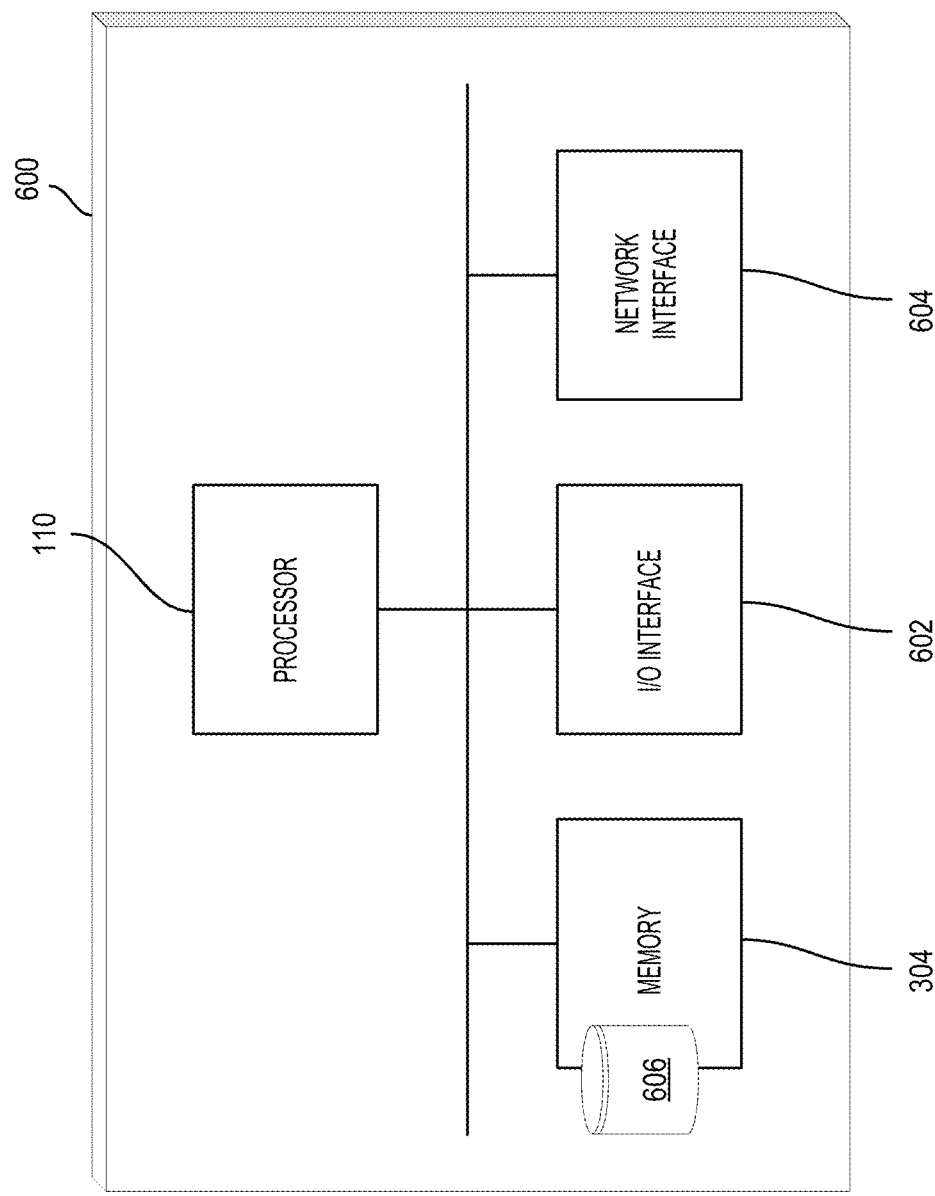
FIG. 6 is a block diagram of a computing device, in accordance with an embodiment.

FIG. 6 is a block diagram of a computing device 600, in accordance with an embodiment.

As an example, the system 300, the terminal 310, and the client devices 308A, 308B of FIG. 3 may be implemented using the example computing device 600 of FIG. 6.

The computing device 600 includes at least one processor 110, memory 304, at least one I/O interface 602, and at least one network communication interface 604.

The processor 110 may be a microprocessor or microcontroller, a digital signal processing (DSP) processor, an integrated circuit, a field programmable gate array (FPGA), a graphic processing unit (GPU), a reconfigurable processor, a programmable read-only memory (PROM), or combinations thereof.

In various embodiments, the computing device 600 may be advantageously particularly adapted to real-time, robust, and/or resilient operation, e.g. by use of RTOS. In various embodiments, the computing device 600 may be advantageously particularly adapted to execute search and/or optimization methods, such as genetic algorithms and/or heuristic algorithms, e.g. by use of GPUs and/or FPGAs adapted for such methods.

The memory 304 may include a computer memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM).

The I/O interface 602 may enable the computing device 600 to interconnect with one or more input devices, such as a keyboard, mouse, camera, touch screen and a microphone, or with one or more output devices such as a display screen and a speaker.

The networking interface 604 may be configured to receive and transmit data sets representative of the machine learning models, for example, to a target data storage or data structures. The target data storage or data structure may, in some embodiments, reside on a computing device or system such as a mobile device.

In various embodiments, the memory 304 and/or the computing device 600 may include a non-transitory computer-readable medium 606 having stored thereon machine interpretable instructions which, when executed by a processor, cause the processor to perform one or more methods.

Figure 7:
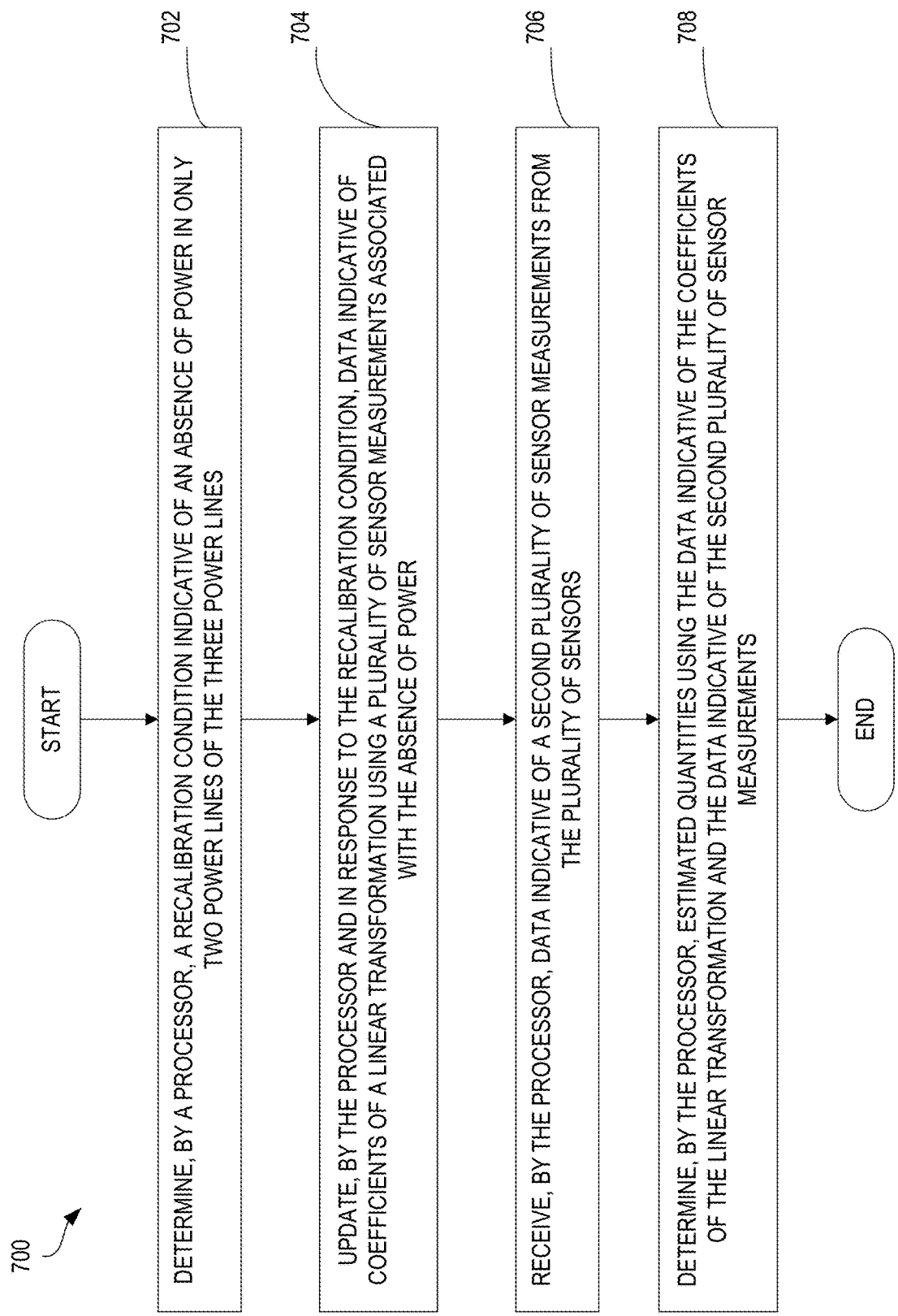
FIG. 7 is a flow chart of a computer-implemented method of adaptive, real-time monitoring of three power lines of a three-phase power system, in accordance with an embodiment.

FIG. 7 is a flow chart of a computer-implemented method 700 of adaptive, real-time monitoring of three power lines of a three-phase power system, in accordance with an embodiment.

Step 702 of the method 700 may include determining, by a processor, a recalibration condition indicative of an absence of power in only two power lines of the three power lines.

Step 704 of the method 700 may include updating, by the processor and in response to the recalibration condition, data indicative of coefficients of a linear transformation using a plurality of sensor measurements associated with the absence of power. The first plurality of sensor measurements may be from a plurality of sensors positioned to measure a field around a portion of the power lines.

For example, absence of power may be due to loss of power in two of the three power lines or re-energization or re-assertion of power in one of the lines while the remaining lines are without power. In various embodiments, the recalibration condition may be a fault condition.

Step 706 of the method 700 may include receiving, by the processor, data indicative of a second plurality of sensor measurements from the plurality of sensors.

Step 708 of the method 700 may include determining, by the processor, estimated quantities using the data indicative of the coefficients of the linear transformation and the data indicative of the second plurality of sensor measurements.

Figure 8:
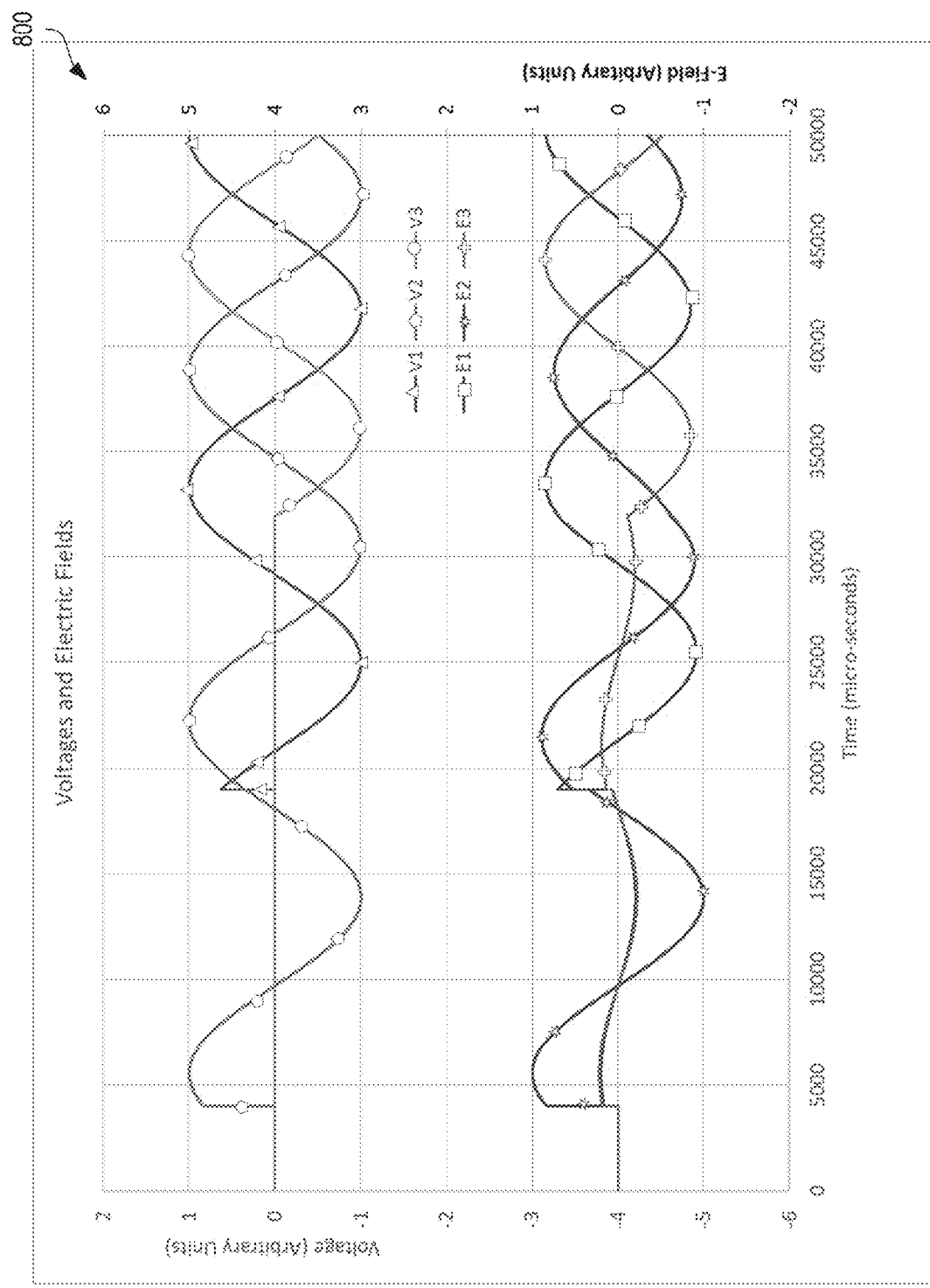
FIG. 8 is a notional plot of voltages in three power lines and electric field measurements from three sensors distributed around the three power lines, in accordance with an embodiment.

FIG. 8 is a notional plot 800 of voltages in three power lines and electric field measurements from three sensors distributed around the three power lines, in accordance with an embodiment.

For example, the three power lines may be power lines of a three-phase power system.

Initially, all three power lines have absence of power, e.g. at times less than 2500 microseconds. The absence of power may be due to a loss of power, e.g. due to a prior event and from a previous condition wherein one or more of power lines are energized. For example, loss of power may be due to shut-down of power to perform maintenance work or make repairs, catastrophic loss of power due to environmental conditions, or natural faults arising in T&D systems.

It is found that even when all three circuit breakers are instructed to connect or energize at the same time or roughly the same time, the re-energization of the power lines may occur temporally sequentially and not temporally simultaneously. For example, without being bound by theory, it is understood that such temporally sequencing of re-energization may arise due to slight variations between individual power system components. In many cases, the temporally sequencing occurs over a time scale much larger than a sampling time scale of electric field sensors, which may allow detection of such sequencing.

Advantageously, the temporally sequencing of re-energization may be used to efficiently determine the relationship between electric field measurements from three electric field sensors and voltages in the three power lines, and/or between magnetic field measurements from three magnetic field sensors and current in the three power lines. It is understood that the field sensors (electric or magnetic) are positioned proximal to corresponding power lines to establish a one-to-one relationship between an electric field sensor and a power line, even though (electric or magnetic) field measurements from a particular power line may be influenced by all three power lines.

The relationship between sensed electric field by the i-th sensor and the voltage in the associated i-th power line (for i=1,2,3) is given as follows $$e_i = \sum_{j=1}^{3} M_{ij} v_j$$

where $M_{ij}$ are coefficients of a matrix M, $e_i$ is a sensed electric field, e.g. at a particular time or filtered to a particular frequency, and $v_j$ is a voltage in the power, e.g. at the particular time or filtered to the particular frequency, respectively. It is understood that M may be determined up to a scale factor, while additional constraints may be introduced to determine the scale factor.

In FIG. 8, $v_2$ (phase 2 voltage) is effectively switched on first at time t=4 ms (4000 micro-seconds), while $v_1$ (phase 1 voltage) is next at t=19 ms, and $v_3$ (phase 3 voltage) last at t=32 ms. Electric fields at the location of each sensor are shown too.

When the phase 2 voltage is switched on, the coefficients $M_{i2}$ (up to a constant scale factor) can be determined by reading off the electric field measurements. Following this, when the phase 1 voltage is switched on, the coefficients $M_{i1}$ can be determined by using the coefficients $M_{i2}$ and (new) electric field measurements. Following this, when the phase 3 voltage is switched on, the coefficients $M_{i3}$ can be determined by using the coefficient $M_{i2}$, $M_{i1}$ and (new) electric field measurements.

In this example $$M_{11}=1, M_{12}=0.20, M_{13}=0.11,$$

$$M_{21}=0.28, M_{22}=1, M_{23}=0.23,$$

$$M_{31}=0.09, M_{32}=0.22, M_{33}=1$$

When V2 is energized at time t=4 ms, we can determine M21, M22, and M23 (all relative to M22) by observing the step in E1, and E2, and E3 at that same time.

Similarly, when V1 is changed (shows step change) at t=19 ms, M11, M12, and M13 (relative to M11) can be determined by observing the step in E1, and E2, and E3 at that same time.

Similar for V3 and M31, M32, and M33 at time t=32 ms when V3 shows a change.

Figure 9:
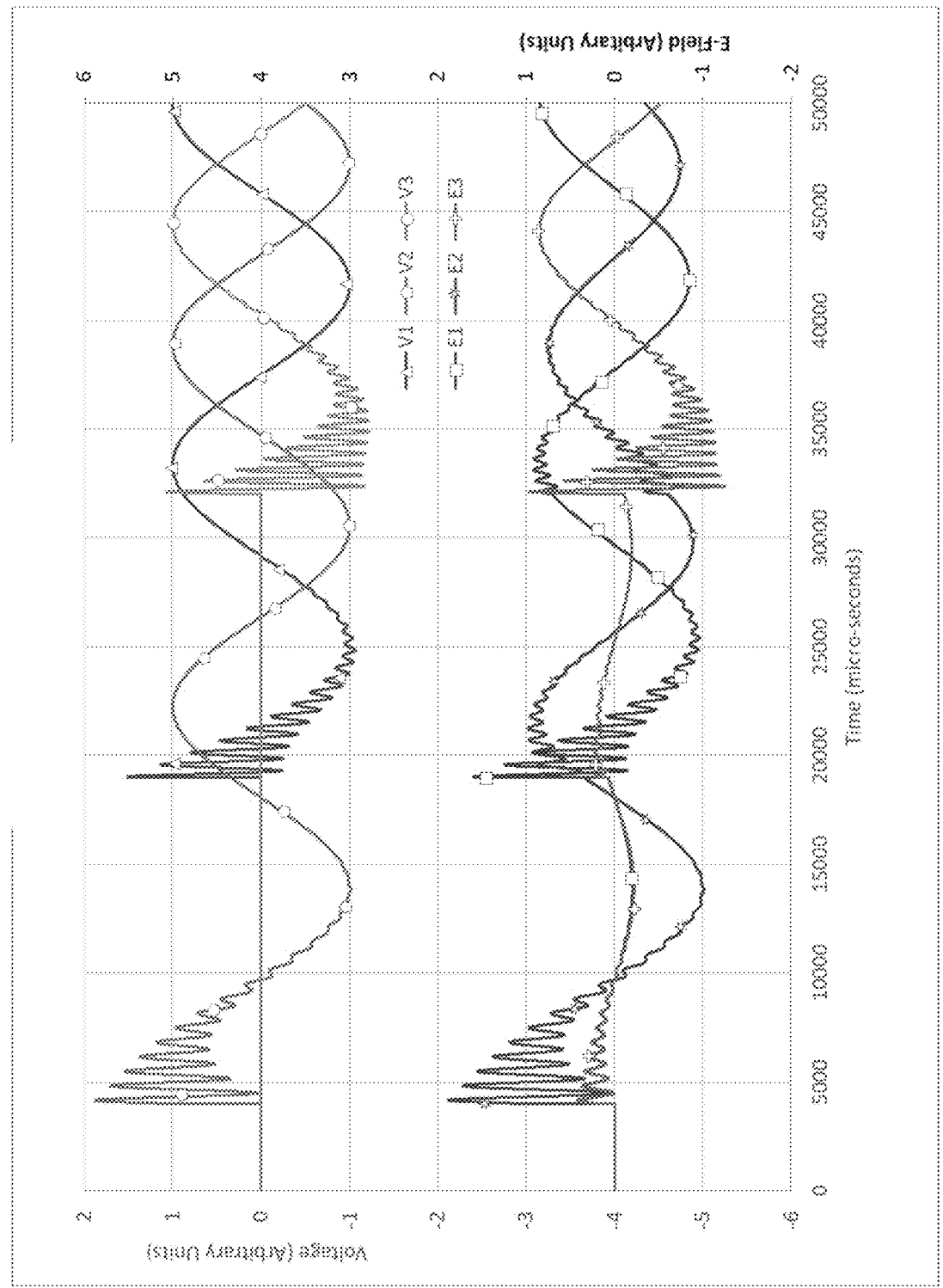
FIG. 9 is a notional plot of voltages in three power lines and electric field measurements from three sensors distributed around the three power lines, in accordance with another embodiment.

FIG. 9 is a notional plot of voltages in three power lines and electric field measurements from three sensors distributed around the three power lines, in accordance with another embodiment.

In FIG. 9, V2 (phase 2 voltage) may be connected first at time t=4 ms, V1 next at t=19 ms, and V3 at t=32 ms, but each connection may include natural switching transients which decay in a few milli-seconds. The frequency of the ringing and decay constants do not need to be the same on each phase (though typically are close to each other for devices on all three phases being from the same model and same vintage). Electric fields at the location of each sensor are shown as well. In this example, M is the same (purely a function of sensor location and sensor sensitivity)

$$M11=1, M12=0.20, M13=0.11,$$

$$M21=0.28, M22=1, M23=0.23,$$

$$M31=0.09, M32=0.22, \text{ and } M33=1$$

Looking at the switching transients ("ringings") may simplify determining the coefficients of matrix M. For example, when V2 is energized at time t=4 ms, we can determine M21, M22, and M23 (all relative to M22) more easily by observing the ringing waveform in E1, and E2, and E3 in the time frame 4 ms to 10 or so.

Computational efficiency, and rapid and accurate determination of coefficients of M may be achieved.

Each transient step (temporally sequential step) may allow relative calculation of a row of M. An absolute calibration of M for each row relative to other rows may be achieved with further constraints on voltages.

Having the rms values of V1, V2, and V3, (from some other voltage sensors, locally or remotely) once the system is fully energized, may allow calibration of the 3 rows of M (and therefore all 9 elements of M) relative to each other.

It may be sufficient to assume that rms values of V1, V2, and V3 are just equal (and they are within 120 degrees of each other), as 3-phase transmission line voltages are usually well balanced. That allows for practical calibration of all 9 elements relative to each other. For absolute calibration, the value of at least one of the voltages may be made available at some point in time.

Once M is known, C can be calculated, (inverse matrix of M), and can be used in the sensor system to reproduce voltage waveforms from E-field waveforms (Vi=Cij Ej summed over j=1, 2, and 3).

It is understood that the foregoing may be applicable to magnetic field measurements for determining current. It is understood that $v_1$ may refer to V1, $v_2$ to V2, $v_3$ to v3, and similarly $M_{ij}$ may refer to $M_{ij}$ for i,j between 1 and 3.

Figure 10:
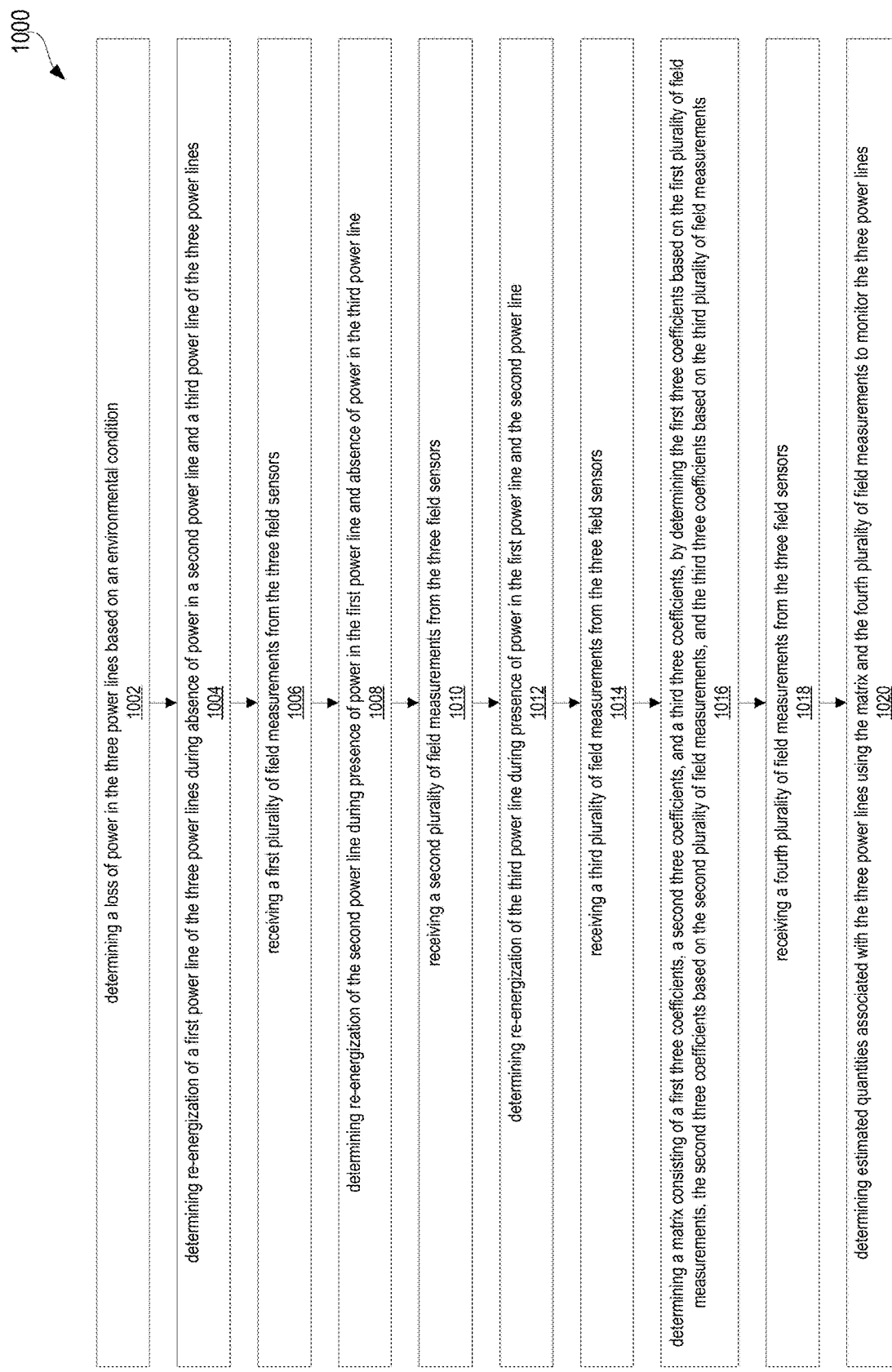
FIG. 10 is a flow chart of method of monitoring three power lines of a three-phase power system using three field sensors.

FIG. 10 is a flow chart of method 1000 of monitoring three power lines of a three-phase power system using three field sensors, each field sensor of the three field sensors being proximal to a corresponding power line of the three power lines relative to every remaining field sensor of the three field sensors.

Step 1002 may include determining a loss of power in the three power lines based on an environmental condition;

Step 1004 may include after determining a loss of power in the three power lines, determining re-energization of a first power line of the three power lines during absence of power in a second power line and a third power line of the three power lines;

Step 1006 may include during presence of power in the first power line and during absence of power in the second power line and the third power line, receiving a first plurality of field measurements from the three field sensors;

Step 1008 may include after determining re-energization of the first power line during absence of power in the second power line and the third power line, determining re-energization of the second power line during presence of power in the first power line and absence of power in the third power line;

Step 1010 may include during presence of power in the first power line and the second power line and absence of power in the third power line, receiving a second plurality of field measurements from the three field sensors;

Step 1012 may include after determining re-energization of the second power line during presence of power in the first power line and absence of power in the third power line, determining re-energization of the third power line during presence of power in the first power line and the second power line;

Step 1014 may include during presence of power in the three power lines, receiving a third plurality of field measurements from the three field sensors.

Step 1016 may include determining a matrix consisting of a first three coefficients, a second three coefficients, and a third three coefficients, by determining the first three coefficients based on the first plurality of field measurements, the second three coefficients based on the second plurality of field measurements, and the third three coefficients based on the third plurality of field measurements.

Step 1018 may include receiving a fourth plurality of field measurements from the three field sensors.

Step 1020 may include determining estimated quantities associated with the three power lines using the matrix and the fourth plurality of field measurements to monitor the three power lines.

The term "connected" or "coupled to" may include both direct coupling (in which two elements that are coupled to each other contact each other) and indirect coupling (in which at least one additional element is located between the two elements).

The embodiments described in this document provide non-limiting examples of possible implementations of the present technology. Upon review of the present disclosure, a person of ordinary skill in the art will recognize that changes may be made to the embodiments described herein without departing from the scope of the present technology. For example, electric field sensors may be non-optical sensors. Yet further modifications could be implemented by a person of ordinary skill in the art in view of the present disclosure, which modifications would be within the scope of the present technology. Moreover, the scope of the present application is not intended to be limited to the particular embodiments of the process, machine, manufacture, composition of matter, means, methods and steps described in the specification.

As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the embodiments are intended to include within their scope such processes, machines, manufacture, compositions of matter, means, methods, or steps.

What is claimed is:

1. A computer-implemented method of adaptive real-time monitoring of power lines of a polyphase power system, the method comprising:
   (a) determining, by one or more processors, a recalibration condition indicative of at least one of a time, a sensed environmental condition, or a user input;
   (b) receiving calibration data indicative of a first plurality of sensor measurements from a plurality of sensors positioned to measure an electric or a magnetic field around a portion of the power lines;
   (c) updating, by the one or more processors and in response to the recalibration condition, data indicative of coefficients of a linear transformation relating the first plurality of sensor measurements to a predetermined vector defined to have components out-of-phase with each other by a predefined phase factor of the polyphase power system, the updating being determined based on optimizing a residual indicative of a deviation of the predetermined vector from estimated calibration quantities while constraining a portion of the coefficients associated with a sensor of the plurality of sensors to be ordered based on an order on the power lines defined by spacings between the sensor and each of the power lines, the estimated calibration quantities being determined based on the data indicative of the coefficients of the linear transformation and the calibration data;
   (d) receiving, by the one or more processors, data indicative of a second plurality of sensor measurements from the plurality of sensors;
   (e) determining, by the one or more processors, estimated quantities using the data indicative of the coefficients of the linear transformation and the data indicative of the second plurality of sensor measurements, the estimated quantities being proportional to one of voltages or currents in the power lines so as to provide monitoring of the power lines;
   (f) detecting an electrical event based on the estimated quantities by determining a relative change in the estimated quantities, wherein the polyphase power system is a three-phase power system defining three power lines, the plurality of sensors includes three field sensors, each of the three field sensors being proximal to a corresponding power line of the three power lines relative to every remaining field sensor of the three field sensors, and the coefficients of the linear transformation consist of a first three coefficients, a second three coefficients, and a third three coefficients;
   (g) determining, by the one or more processors, a loss of power in the three power lines based on an environmental condition;
   (h) after determining, by the one or more processors, the loss of power in the three power lines, determining, by the one or more processors, reenergization of a first power line of the three power lines during absence of power in a second power line and a third power line of the three power lines;
   (i) during presence of power in the first power line and during absence of power in the second power line and the third power line, receiving, by the one or more processors, a first plurality of field measurements from the three field sensors;
   (j) after determining re-energization of the first power line during absence of power in the second power line and the third power line, determining, by the one or more processors, reenergization of the second power line during presence of power in the first power line and absence of power in the third power line;
   (k) during presence of power in the first power line and the second power line and absence of power in the third power line, receiving, by the one or more processors, a second plurality of field measurements from the three field sensors;
   (l) after determining re-energization of the second power line during presence of power in the first power line and absence of power in the third power line, determining, by the one or more processors, re-energization of the third power line during presence of power in the first power line and the second power line;
   (m) during presence of power in the three power lines, receiving, by the one or more processors, a third plurality of field measurements from the three field sensors; and
   (n) determining, by the one or more processors, the data indicative of the coefficients of the linear transformation by determining the first three coefficients based on the first plurality of field measurements, determining the second three coefficients based on the second plurality of field measurements, and determining the third three coefficients based on the third plurality of field measurements.

* * * * *